(12) United States Patent
Chen

(10) Patent No.: US 11,960,467 B2
(45) Date of Patent: Apr. 16, 2024

(54) DATA STORAGE METHOD, DATA OBTAINING METHOD, AND APPARATUS

(71) Applicant: HUAWEI TECHNOLOGIES CO., LTD., Guangdong (CN)

(72) Inventor: Ming Chen, Chengdu (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 536 days.

(21) Appl. No.: 17/179,591

(22) Filed: Feb. 19, 2021

(65) Prior Publication Data

US 2021/0173824 A1     Jun. 10, 2021

Related U.S. Application Data

(63) Continuation of application No. PCT/CN2018/101597, filed on Aug. 21, 2018.

(51) Int. Cl.
  *G06F 16/20* (2019.01)
  *G06F 16/23* (2019.01)
  *G06N 3/044* (2023.01)
  *G06N 3/08* (2023.01)

(52) U.S. Cl.
  CPC ......... *G06F 16/2358* (2019.01); *G06N 3/044* (2023.01); *G06N 3/08* (2013.01)

(58) Field of Classification Search
  CPC ...... G06F 16/2358; G06N 3/044; G06N 3/08; H03M 7/3044; H03M 7/3073
  See application file for complete search history.

(56) References Cited

U.S. PATENT DOCUMENTS

| | | | |
|---|---|---|---|
| 6,138,090 A | 10/2000 | Inoue | |
| 9,026,505 B1 * | 5/2015 | Huang | G06F 16/1748 707/693 |
| 2003/0135524 A1 * | 7/2003 | Cane | G06F 11/1451 |
| 2005/0071390 A1 * | 3/2005 | Midgley | G06F 11/1451 |
| 2010/0293147 A1 * | 11/2010 | Snow | G06F 16/10 707/E17.007 |
| 2011/0251986 A1 | 10/2011 | Potkonjak | |
| 2012/0166401 A1 | 6/2012 | Li et al. | |
| 2017/0259944 A1 | 9/2017 | Malta et al. | |

FOREIGN PATENT DOCUMENTS

| | | |
|---|---|---|
| CN | 101499094 A | 8/2009 |
| CN | 102222085 A | 10/2011 |
| CN | 102323922 A | 1/2012 |
| CN | 102760250 A | 10/2012 |
| CN | 103959259 A | 7/2014 |
| CN | 104462422 A | 3/2015 |

(Continued)

OTHER PUBLICATIONS

Machine Translation of JP 2006259937, by Nakamura et al., dated Sep. 28, 2006 (Year: 2006).*

(Continued)

*Primary Examiner* — Mahesh H Dwivedi
(74) *Attorney, Agent, or Firm* — WOMBLE BOND DICKINSON (US) LLP

(57) ABSTRACT

A method for storing data includes: generating data for current data based on historical data and a change rule of the historical data; obtaining a delta between the data and the current data; storing the delta instead of the current data.

19 Claims, 26 Drawing Sheets

(56) References Cited

FOREIGN PATENT DOCUMENTS

| | | |
|---|---|---|
| CN | 104636272 A | 5/2015 |
| CN | 105025298 A | 11/2015 |
| CN | 105205014 A | 12/2015 |
| CN | 105556566 A | 5/2016 |
| CN | 106909990 A | 6/2017 |
| CN | 107357764 A | 11/2017 |
| JP | 2006259937 A | 9/2006 |
| WO | 2015059930 A1 | 4/2015 |

OTHER PUBLICATIONS

Article entitled "RAISR: Rapid and Accurate Image Super Resolution", by Romano et al., dated Jan. 2017 (Year: 2017).*

Article entitled "Nonlinear gain in online prediction of blood glucose profile in type 1 diabetic patients", by Estrada et al., dated Dec. 17, 2010 (Year: 2010).*

Article entitled "Perceptron based Neural Network Predictors in Lossless Data Compression", by Logeswaran, dated 2000 (Year: 2000).*

* cited by examiner

DATA STORAGE METHOD, DATA OBTAINING METHOD, AND APPARATUS

CROSS-REFERENCE TO RELATED APPLICATIONS

This application is a continuation of International Application No. PCT/CN2018/101597, filed on Aug. 21, 2018, the disclosure of which is hereby incorporated by reference in its entirety.

TECHNICAL FIELD

Embodiments of this disclosure relate to the field of data processing technologies, and in particular, to a data storage method, a data obtaining method, and an apparatus.

BACKGROUND

As emerging applications such as an artificial intelligence (AI) application, a big data application, and an internet of things application become mature, data that needs to be stored sharply increases. If the sharply increasing data is stored only by increasing a capacity of a storage device, purchase costs and management costs of the storage device are relatively high, and the storage device occupies relatively large space and consumes relatively high power. This causes a relatively heavy cost burden to an enterprise. Therefore, an effective data storage solution is required.

SUMMARY

Embodiments of this disclosure provide a data storage method, a data obtaining method, and an apparatus, to reduce storage overheads. In addition, the embodiments of this disclosure further provide a data compression method, a data decompression method, and an apparatus, to reduce a compression or decompression time.

According to a first aspect, an embodiment of this disclosure provides a method for storing, where the method may include: generating data for current data based on historical data and a change rule of the historical data; obtaining a delta between the data and the current data; storing the delta instead of the current data.

In an embodiment, the storing the delta comprises:
compressing the delta.

In an embodiment, the generating data comprises:
generating the data with an artificial intelligence (AI) neural algorithm.

In an embodiment, the method further comprises:
storing a correspondence between the delta and the AI neural algorithm.

In an embodiment, a type of the AI neural algorithm is a normalized least mean square (NLMS) type, a single-layer perceptron (SLP) type, a multilayer perceptron (MLP) type or recurrent neural network (RNN) type.

According to a second aspect, an embodiment of this disclosure provides a data restoration method, where the method may include:
obtaining a delta;
generating data for current data based on historical data and a change rule of the historical data; wherein the delta is a delta between the data and the current data;
restoring the current data based on the data and the delta.

According to a third aspect, an embodiment of this disclosure provides a data storage method, applied to a storage device, where the method may include: obtaining current data and historical data of the current data; predicting the current data by using the historical data, to obtain predicted data of the current data, where the predicted data is data obtained after the current data is predicted according to a change rule of the historical data; obtaining a delta between the current data and the predicted data; and storing preset data when an absolute value of the delta is less than or equal to a preset threshold. In an embodiment, storage space occupied by the preset data is smaller than storage space occupied by the current data. In this technical solution, because the storage space occupied by the preset data is smaller than the storage space occupied by the current data, compared with that in a technical solution of directly storing the current data in the prior art, storage overheads can be reduced.

In an embodiment, the preset data is predefined by the storage device. Optionally, the preset data may be an identifier, and the identifier is used to indicate that the predicted data of the current data can be used as (or approximately used as) the current data. In an embodiment, the storage space occupied by the preset data is smaller than storage space occupied by each of most or all pieces of to-be-stored data.

In an example in which the delta is a difference, when the absolute value of the delta is 0, a compression process in this technical solution is a lossless compression process. When the absolute value of the delta is not 0, a compression process in this technical solution is a lossy compression process. Setting the preset threshold properly helps limit a data loss rate within a specific range. In other words, the preset threshold may be set based on an actual requirement (for example, a requirement within an acceptable lossy compression rate). This technical solution may be applied to a scenario in which a specific data loss is allowed, for example, a scenario such as video playing.

In an embodiment, the method further includes: when an absolute value of the delta is greater than a preset threshold, storing the current data or a value obtained by compressing the current data. An algorithm used to perform compression may be, for example, but is not limited to a dictionary compression algorithm and/or a deduplication algorithm.

In an embodiment, the method further includes: storing identifier information when the absolute value of the delta is greater than the preset threshold, where the identifier information is used to indicate that stored information used to restore the current data is the value obtained by compressing the current data, or when the current data is stored, the identifier information is used to indicate that stored information used to restore the current data is the current data. The identifier information may be used as identifier information of the information used to restore the current data, or may be used as information carried in the information used to restore the current data. This technical solution helps the storage device identify a type of the stored information used to restore the current data, where the type may be a type of "preset data" or a type of "current data or value obtained by compressing the current data", thereby helping implement a data obtaining procedure.

Based on any technical solution provided in the first aspect or the third aspect, the following provides several possible designs.

In an embodiment, the method further includes: storing a correspondence between the information used to restore the current data and a parameter of the AI neural algorithm used to perform the prediction. This helps restore the current data correctly. For example, the storage device performs a snapshot operation each time after the parameter of the AI neural algorithm is updated, to record a correspondence between information used to restore current data and the parameter of the AI neural algorithm used to perform prediction.

In an embodiment, after the information used to restore the current data is stored, the method further includes: updating a parameter of the AI neural algorithm through adaptive learning; and updating, based on an updated parameter of the AI neural algorithm, the information used to restore the current data. This helps restore the current data correctly.

In an embodiment, the foregoing parameter of the AI neural algorithm used to perform prediction is marked as a first parameter of the AI neural algorithm, and a parameter obtained after the first parameter of the AI neural algorithm is updated is marked as a second parameter of the AI neural algorithm. Based on this, the updating, based on an updated parameter of the AI neural algorithm, the information used to restore the current data includes: reading the information used to restore the current data; restoring the current data based on the first parameter (namely, the parameter of the AI neural algorithm before the update) of the AI neural algorithm, the read information used to restore the current data, and the historical data of the current data; predicting the current data based on the second parameter (namely, the updated parameter of the AI neural algorithm) of the AI neural algorithm and the historical data of the current data, to obtain second predicted data, where the second predicted data is data obtained after the current data is predicted according to the change rule of the historical data based on the second parameter of the AI neural algorithm; obtaining a second delta between the current data and the second predicted data; and when storage space occupied by the second delta is smaller than storage space occupied by the current data, updating, to the second delta or a value obtained by compressing the second delta, the stored information used to restore the current data.

In an embodiment, the storage device includes an AI computing card, and the predicting the current data by using the historical data, to obtain first predicted data includes: predicting the current data by using the AI computing card and the historical data, to obtain the first predicted data.

In an embodiment, the storage device includes memory. Obtaining current data in at least two pieces of to-be-stored data and historical data of the current data includes: obtaining the current data in the at least two pieces of to-be-stored data and the historical data of the current data from the memory.

In an embodiment, for any to-be-stored data, the to-be-stored data is deleted from the memory when the to-be-stored data is not used as historical data of other to-be-stored data, so as to reduce storage overheads of the memory.

According to a fourth aspect, an embodiment of this disclosure provides a data obtaining method, applied to a storage device, where the method may include: reading information used to restore current data; predicting the current data by using historical data when the information used to restore the current data includes preset data, to obtain predicted data of the current data, where the predicted data is data obtained after the current data is predicted according to a change rule of the historical data; and using the predicted data as current data. For example, the historical data is one or more pieces of obtained data.

In an embodiment, when the information that is read by the storage device and that is used to restore the current data carries no identifier information, it indicates that the information used to restore the current data includes the preset data. For a related description of the identifier information, refer to the foregoing third aspect. Details are not described herein again.

It may be understood that, when the information that is read by the storage device and that is used to restore the current data carries identifier information, it indicates that the information used to restore the current data includes the current data or a value obtained by compressing the current data. In this case, the fourth aspect may be replaced with the solution 1 or the solution 2 described above.

The technical solution provided in the fourth aspect may be combined with the solution 1/solution 2, so as to form a new technical solution.

The fourth aspect or the replacement solution of the fourth aspect corresponds to the technical solution provided in the third aspect and a corresponding design solution of the technical solution. Therefore, for a specific implementation and a beneficial effect of the fourth aspect or the replacement solution of the fourth aspect, refer to the third aspect.

Based on any technical solution provided in the second aspect or the fourth aspect, the following provides several possible designs.

In an embodiment, the storage device includes memory, and before the predicting the current data by using historical data, to obtain predicted data of the current data, the method further includes: obtaining the historical data from the memory.

In an embodiment, the method further includes: storing, by the storage device, the current data in the memory, to use the current data as historical data of other to-be-obtained data.

In an embodiment, the method further includes: deleting, by the storage device, obtained data from the memory when the obtained data is no longer used as historical data of to-be-obtained data, to reduce storage overheads of the memory.

In an embodiment, the method further includes: obtaining, based on a correspondence between the information used to restore the current data and a parameter of an AI neural algorithm, the parameter of the AI neural algorithm used to predict the current data; and the predicting the current data by using the historical data, to obtain the predicted data includes: predicting the current data based on the obtained parameter of the AI neural algorithm by using the historical data, to obtain the predicted data.

In an embodiment, the storage device includes an AI computing card, and the predicting the current data by using the historical data includes: predicting the current data by using the AI computing card and the historical data.

According to a fifth aspect, an embodiment of this disclosure provides a data compression method, applied to a storage device, where the storage device stores at least two sets, each set includes one or more mapping relationships, each mapping relationship is a mapping relationship between one piece of first data and one piece of second data, storage space occupied by the first data is larger than storage space occupied by the second data, each set corresponds to a hit rate range, different sets correspond to different hit rate ranges. The method may include: obtaining a hit rate of to-be-compressed data; determining a target set in the at least two sets based on the hit rate of the to-be-compressed data, where the hit rate of the to-be-compressed data is used to determine a hit rate of a target mapping relationship to which the to-be-compressed data belongs, and the determined hit rate of the target mapping relationship belongs to a hit rate range corresponding to the target set; and searching first data in the target set for the to-be-compressed data, to determine second data corresponding to the to-be-compressed data, and using the second data corresponding to the to-be-compressed data as a value obtained by compressing the to-be-compressed data.

According to a sixth aspect, an embodiment of this disclosure provides a data decompression method, applied to a storage device, where the storage device stores at least two sets, each set includes one or more mapping relationships, each mapping relationship is a mapping relationship between one piece of first data and one piece of second data, storage space occupied by the first data is larger than storage space occupied by the second data, each set corresponds to a hit rate range, different sets correspond to different hit rate ranges. The method may include: obtaining a hit rate of to-be-decompressed data; determining a target set in the at least two sets based on the hit rate of the to-be-decompressed data, where the hit rate of the to-be-decompressed data is used to determine a hit rate of a target mapping relationship to which the to-be-decompressed data belongs, and the determined hit rate of the target mapping relationship belongs to a hit rate range corresponding to the target set; and searching second data in the target set for the to-be-decompressed data, to determine first data corresponding to the to-be-decompressed data, and using the first data corresponding to the to-be-decompressed data as a value obtained by decompressing the to-be-decompressed data.

According to a seventh aspect, an embodiment of this disclosure provides a data compression method, applied to a storage device, where storage media of the storage device include a cache, memory, and a hard disk, a hit rate of a mapping relationship in the cache is greater than or equal to a hit rate of a mapping relationship in the memory, the hit rate of the mapping relationship in the memory is greater than or equal to a hit rate of a mapping relationship in the hard disk, each mapping relationship is a mapping relationship between one piece of first data and one piece of second data, storage space occupied by the first data is larger than storage space occupied by the second data. The method includes: obtaining a hit rate of to-be-compressed data; determining a target storage medium based on the hit rate of the to-be-compressed data, where the hit rate of the to-be-compressed data is used to determine a hit rate of a target mapping relationship to which the to-be-compressed data belongs, and the target storage medium is the cache when the determined hit rate of the target mapping relationship belongs to a hit rate range of the mapping relationship in the cache, the target storage medium is the memory when the determined hit rate of the target mapping relationship does not belong to a hit rate range of the mapping relationship in the cache but belongs to a hit rate range of the mapping relationship in the memory, or the target storage medium is the hard disk when the determined hit rate of the target mapping relationship does not belong to a hit rate range of the mapping relationship in the memory; and searching first data in the target storage medium for the to-be-compressed data, to determine second data corresponding to the to-be-compressed data, and using the second data corresponding to the to-be-compressed data as a value obtained by compressing the to-be-compressed data.

According to an eighth aspect, an embodiment of this disclosure provides a data decompression method, applied to a storage device, where storage media of the storage device include a cache, memory, and a hard disk, a hit rate of a mapping relationship in the cache is greater than or equal to a hit rate of a mapping relationship in the memory, the hit rate of the mapping relationship in the memory is greater than or equal to a hit rate of a mapping relationship in the hard disk, each mapping relationship is a mapping relationship between one piece of first data and one piece of second data, storage space occupied by the first data is larger than storage space occupied by the second data. The method may include: obtaining a hit rate of to-be-decompressed data; determining a target storage medium based on the hit rate of the to-be-decompressed data, where the hit rate of the to-be-decompressed data is used to determine a hit rate of a target mapping relationship to which the to-be-decompressed data belongs, and the target storage medium is the cache when the determined hit rate of the target mapping relationship belongs to a hit rate range of the mapping relationship in the cache, the target storage medium is the memory when the determined hit rate of the target mapping relationship does not belong to a hit rate range of the mapping relationship in the cache but belongs to a hit rate range of the mapping relationship in the memory, or the target storage medium is the hard disk when the determined hit rate of the target mapping relationship does not belong to a hit rate range of the mapping relationship in the memory; and searching second data in the target storage medium for first data corresponding to the to-be-decompressed data, and using the first data corresponding to the to-be-decompressed data as a value obtained by decompressing the to-be-decompressed data.

It should be noted that, for a beneficial effect that can be achieved in the data compression method provided in the fifth or seventh aspect, refer to the description in the first aspect. For a beneficial effect that can be achieved in the data decompression method provided in the sixth or eighth aspect, refer to the description in the second aspect. In an example, the mapping relationship described in the fifth aspect and the seventh aspect may be a mapping relationship included in a dictionary of a dictionary compression algorithm.

According to a ninth aspect, an embodiment of this disclosure provides a storage device, where the storage device may be configured to perform any one of the methods provided in the first aspect to the eighth aspect.

In an embodiment, function module division may be performed on the storage device according to any one of the methods provided in the first aspect to the eighth aspect. For example, each function module may be obtained through division according to each function, or two or more functions may be integrated into one processing module.

In another embodiment, the storage device includes a memory and a processor, where the memory is configured to store program code, and the processor is configured to invoke the program code to perform any one of the methods provided in the first aspect to the eighth aspect.

It should be noted that the memory and the processor described in this disclosure may be integrated into one chip, or may be separately disposed in different chips. A type of the memory and a manner of disposing the memory and the processor are not limited in this disclosure.

It may be understood that any storage device, computer-readable storage medium, or computer program product provided above is configured to perform a corresponding method provided above. Therefore, for a beneficial effect that can be achieved by the storage device, computer-readable storage medium, or computer program product, refer to a beneficial effect in the corresponding method. Details are not described herein again.

BRIEF DESCRIPTION OF DRAWINGS

FIG. 6-1 to FIG. 6-4 are a schematic diagram 2 of a data storage method according to an embodiment of this disclosure;

DESCRIPTION OF EMBODIMENTS

Figure 1:
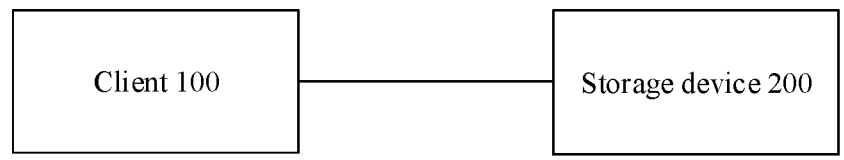
FIG. 1 is a schematic diagram of a system architecture applicable to an embodiment of this disclosure.

FIG. 1 is a schematic diagram of a system architecture applicable to an embodiment of this disclosure. The system architecture shown in FIG. 1 includes a client 100 and a storage device 200.

In a data write procedure, the client 100 is configured to send a write request to the storage device 200. The write request includes one or more pieces of to-be-written data and address information of each piece of to-be-written data. After receiving the write request, the storage device 200 successively stores each piece of to-be-written data in storage space indicated by address information of the to-be-written data, or stores, in the storage space indicated by the address information of the to-be-written data, data obtained after the to-be-written data is processed (for example, one or more of prediction, delta calculation, and compression in the following).

In a data read procedure, the client 100 is configured to send a read request to the storage device 200. The read request includes address information of one or more pieces of to-be-read data. After receiving the read request, the storage device 200 successively reads data from storage space indicated by address information of each piece of to-be-read data, and then feeds back the read data to the client 100, or feeds back data obtained after the read data is processed (for example, one or more of prediction, delta calculation, and decompression in the following) to the client 100.

It should be noted that the system architecture shown in FIG. 1 is only an example of a system architecture applicable to this embodiment of this disclosure, and does not constitute a limitation on the system architecture applicable to this embodiment of this disclosure. For example, the system architecture applicable to this embodiment of this disclosure may include one storage device 200 and a plurality of clients 100, or include one client 100 and a plurality of storage devices 200.

It may be understood that the client 100 is a logical function module. For an example of a function that can be implemented by the logical function module, refer to the foregoing description. In FIG. 1, an example in which the client 100 is independent of the storage device 200 is used for description. In this case, in hardware implementation, the client 100 may be integrated into a device independent of the storage device 200. In addition, in some embodiments, for example, in a hyper-converged scenario or in an integrated storage and computing device, the client 100 may serve as a logical function module in the storage device 200. In this case, in hardware implementation, the client 100 may be implemented by a storage medium (such as memory) and a processor (such as a central processing unit (CPU)) in the storage device 200 jointly. Specifically, the storage medium stores a program instruction. When the program instruction is invoked by the processor, the processor is enabled to perform a function that can be implemented by the client 100. Certainly, the client 100 may be alternatively implemented by a storage medium (such as memory), a processor, and other hardware in the storage device 200 jointly. This is not limited in this embodiment of this disclosure. Unless otherwise specified, the following uses an example in which technical solutions provided in the embodiments of this disclosure are applied to the system architecture shown in FIG. 1 for description.

Figure 2:
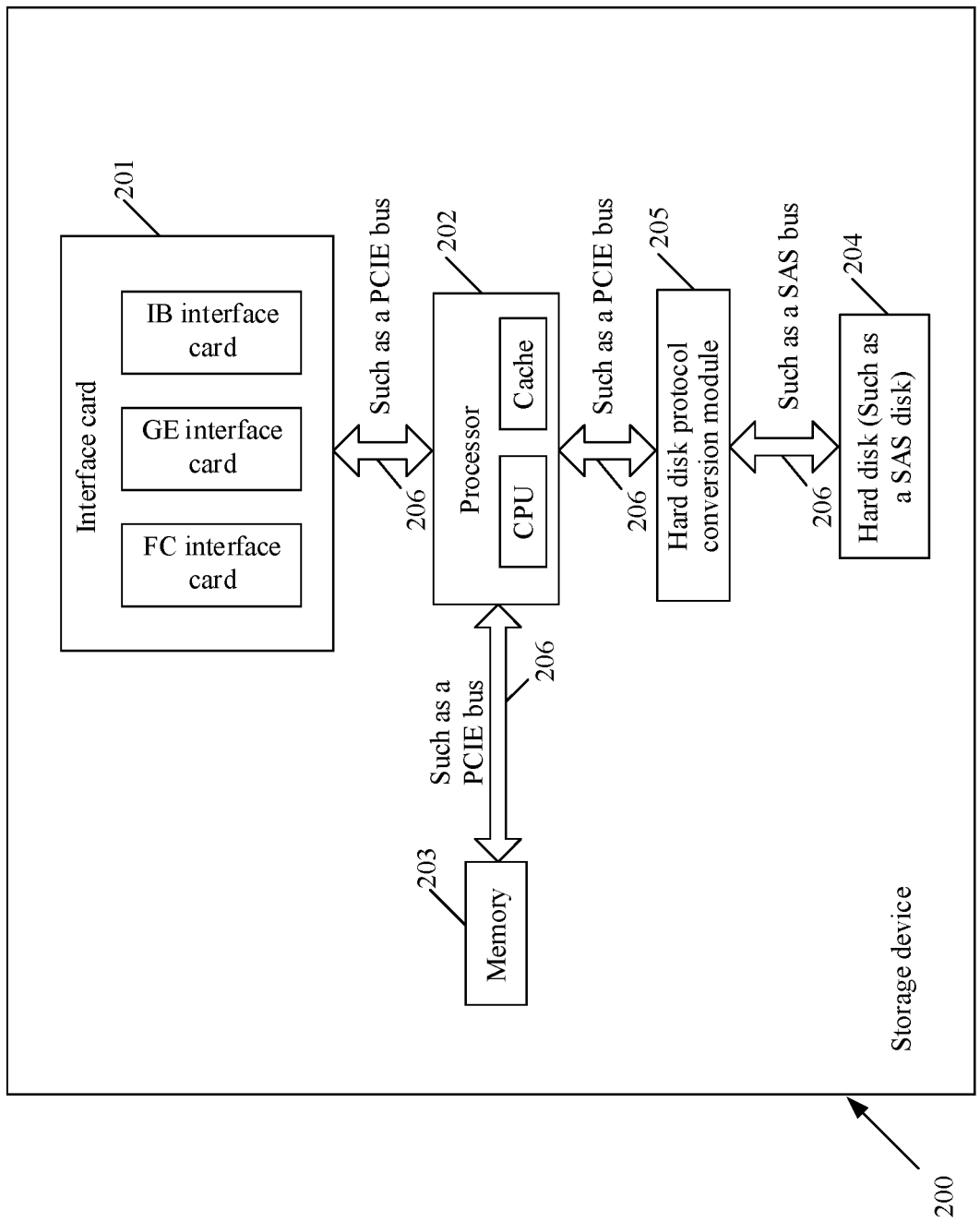
FIG. 2 is a schematic diagram of a hardware structure of a storage device applicable to an embodiment of this disclosure.

FIG. 2 is a schematic diagram of a hardware structure of a storage device 200 applicable to an embodiment of this disclosure. The storage device 200 shown in FIG. 2 includes an interface card 201, a processor 202, a main memory (such as memory) 203, a secondary memory 204 (such as a hard disk), a protocol conversion module 205, and a bus 206. For a connection relationship between these components, refer to FIG. 2. In this embodiment of this disclosure, the hard disk includes but is not limited to a storage medium such as a hard disk drive (HDD) or a solid-state disk (SSD). It should be noted that the following uses an example in which the main memory 203 is the memory (which is marked as memory 203), the secondary memory 204 is the hard disk (which is marked as a hard disk 204), and the protocol conversion module 205 is a hard disk protocol conversion module (which is marked as a hard disk protocol conversion module 205) for description. This is uniformly described herein. Details are not described in the following again.

The interface card 201, the processor 202, the memory 203, the hard disk 204, and the hard disk protocol conversion module 205 may be connected to each other through the bus 206. The bus 206 may include at least one of the following: a peripheral component interconnect (PCI) bus, a PCIE (PCI express) bus, a serial attached SCSI (SAS) bus, a SATA (SATA) bus, and an extended industrial standard structure (EISA) bus. SCSI is short for "small computer system interface". The bus 206 may include one or more of an address bus, a data bus, a control bus, and the like. For ease of denotation, the bus 206 is denoted by using arrowed lines in FIG. 2. However, this does not indicate that there is only one bus or only one type of bus.

The interface card 201 may also be referred to as a front-end protocol conversion module, and is configured to perform transmission protocol conversion on received information, for example, to convert information received from the client 100 by using an optical network communication protocol or an Ethernet communication protocol into information that uses a PCIE protocol, or for another example, to convert information received from the processor 202 by using a PCIE protocol into information that uses an optical network communication protocol or an Ethernet communication protocol. The interface card 201 may include at least one of the following: a fibre channel (FC) interface card, a gigabit Ethernet (GE) interface card, an interface bus (IB) interface card, and the like.

The processor 202 is a control center of the storage device 200, and may be configured to control other components such as the memory 203, the hard disk 204, and the hard disk protocol conversion module 205 in the storage device 200 to work, so as to implement the technical solutions provided in the embodiments of this disclosure. For a specific example, refer to the following description.

In an embodiment, the processor 202 may include a CPU, and may include one or more CPUs.

In an embodiment, the processor 202 may include a CPU and a cache (namely, a CPU cache). The cache is a high-speed memory between the CPU and the memory 203, and is mainly configured to improve read/write performance of the storage device 200. For example, data stored in the cache may be some data stored in the memory 203. If the cache includes to-be-accessed data (for example, to-be-read data or data obtained after to-be-read data is processed), the CPU may obtain the to-be-accessed data from the cache without a need of obtaining the to-be-accessed data from the memory 203, thereby increasing a data read rate.

The memory 203 may be configured to: cache information (for example, information carried in a write request or a read request) from the interface card 201, so that the processor 202 invokes the information cached in the memory 203, to implement the technical solutions provided in the embodiments of this disclosure; or cache information (for example, to-be-read data) from the processor 202, so that the processor 202 invokes the information cached in the memory 203 and sends the information to the interface card 201, to enable the interface card 201 to successively perform transmission protocol conversion on the cached information. In addition, the memory 203 is a memory between the processor 202 and the hard disk 204, and is configured to improve read/write performance of the storage device 200. For example, data stored in the memory 203 may be some data stored in the hard disk 204. If the memory includes to-be-accessed data, the CPU may obtain the to-be-accessed data from the memory 203 without a need of obtaining the to-be-accessed data from the hard disk 204, thereby increasing a data read rate.

The hard disk 204 is configured to store data. Through classification based on supported transmission protocols, the hard disk 204 may include at least one of the following: a SAS disk (or a SAS expansion enclosure), a PCIE disk, a SATA disk, and the like.

The hard disk protocol conversion module 205 may also be referred to as a back-end protocol conversion module, is located between the processor 202 and the hard disk 204, and is configured to perform transmission protocol conversion on received information, for example, to convert information received from the processor 202 by using a PCIE protocol into information that uses a protocol such as a SAS protocol or a SATA protocol applicable to the hard disk 204, or for another example, to convert information received from the hard disk 204 by using a SAS protocol, a SATA protocol, or the like into information that uses a protocol such as a PCIE protocol applicable to the processor 202. In an example in which the hard disk 204 is the SAS disk, the hard disk protocol conversion module 205 may be a SAS protocol conversion chip, a SAS interface card, or the like.

In the storage device 200 shown in FIG. 2, the processor 202 may be configured to perform operations such as prediction, delta calculation, compression, and decompression described in the following. For a specific example, refer to the following description. In this case, it may be considered that the processor 202 performs the operations such as the prediction, the delta calculation, the compression, and the decompression by invoking a program.

It should be noted that the storage device 200 shown in FIG. 2 is only an example of a storage device applicable to this embodiment of this disclosure, and does not constitute a limitation on the storage device applicable to this embodiment of this disclosure. The storage device applicable to this embodiment of this disclosure may alternatively include more or fewer components than those in the storage device 200.

For example, if the processor 202 and the hard disk 204 use a same protocol, for example, both use a PCIE protocol, the storage device 200 may not include the hard disk protocol conversion module 205.

Figure 3:
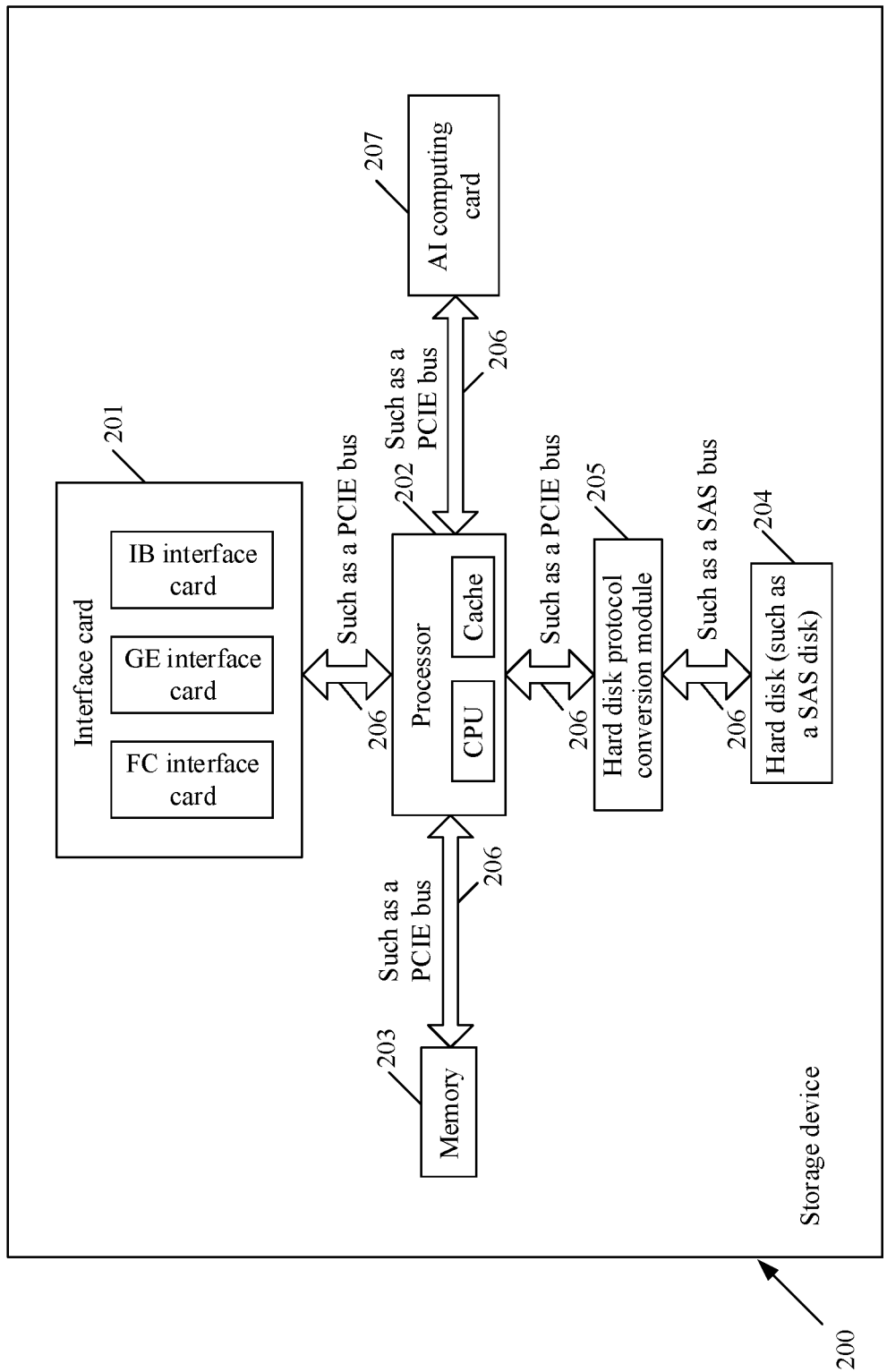
FIG. 3 is a schematic diagram of a hardware structure of a storage device applicable to another embodiment of this disclosure.

For another example, as shown in FIG. 3, based on the storage device 200 shown in FIG. 2, the storage device 200 may further include an AI computing card 207. The AI computing card 207 is configured to implement an AI computing function under control of the processor 202, for example, perform operations such as prediction and delta calculation described in the following. For a specific example, refer to the following description. The AI computing card may be, for example, an AI computing chip. Certainly, this embodiment of this disclosure is not limited thereto. In this example, when the AI computing card is configured to perform the operations such as the prediction and the delta calculation, the processor 202 may not need to perform the operations such as the prediction and the delta calculation.

For still another example, the storage device 200 may further include a compression/decompression module, configured to perform operations such as compression and decompression under control of the processor 202. For a specific example, refer to the following description. In this example, the processor 202 may not need to perform the operations such as the compression and the decompression. The compression/decompression module described herein may be hardware such as a chip.

It may be understood that, if no collision occurs, any two or more of the foregoing examples may be used in combination, so as to form a new hardware architecture of the storage device 200. For example, the storage device 200 may include both the AI computing card 207 and the compression/decompression module.

The hardware structure of the storage device 200 described above is described by using the system architecture shown in FIG. 1 as an example. In an embodiment in which the client 100 is a logical function module in the storage device 200, any foregoing provided hardware structure of the storage device 200 may not include the interface card 201 or the bus 206 between the interface card 201 and the processor 202. A processor configured to implement a function of the client 100 and the foregoing processor 202 may be a same processor, or may be different processors.

The following briefly describes related technologies in the embodiments of this disclosure.

(1) AI Neural Algorithm

Figure 4:
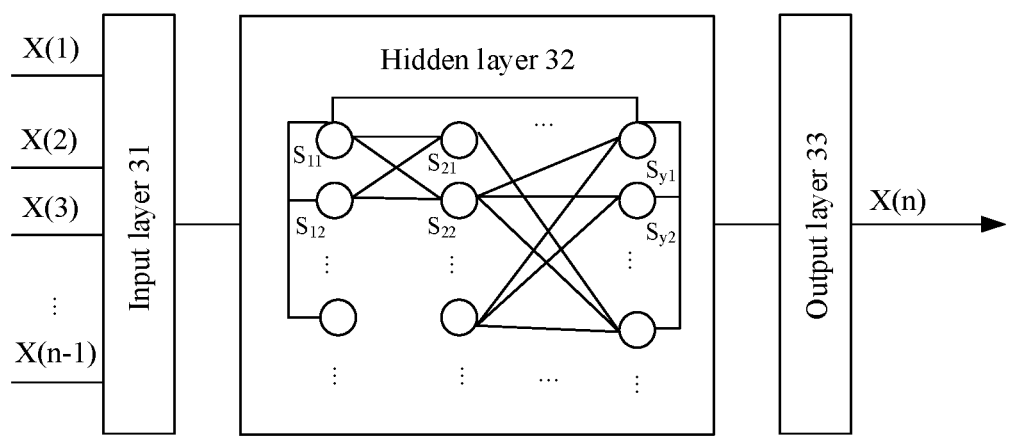
FIG. 4 is a schematic diagram of an AI neural algorithm applicable to an embodiment of this disclosure.

FIG. 4 is a schematic diagram of an AI neural algorithm applicable to an embodiment of this disclosure. In FIG. 4, the AI neural algorithm may include an input layer 31, a hidden layer 32, and an output layer 33.

The input layer 31 is configured to receive a value of an input variable, and send the received value of the input variable to the hidden layer 32 directly or after processing. A function of the processing is to obtain information that can be identified by the hidden layer 32. The input variable is one or more pieces of data before to-be-predicted data. A quantity of input variables at the input layer 31 and specific data that is used as the input variable and that is before the to-be-predicted data may be flexibly adjusted based on a prediction precision requirement. For example, if the to-be-predicted data is an $n^{th}$ piece of data and is marked as X(n), the input variable may be any one or more pieces of data in n−1 pieces of data (marked as X(1), X(2), . . . , and X(n−1)) before the to-be-predicted data X(n). n≥1, and n is an integer.

The hidden layer 32 is configured to: predict the to-be-predicted data based on the value that is of the input variable and that is received from the input layer 31, and send a prediction result to the output layer 33. The hidden layer 32 includes y neural networks, where y≥1, and y is an integer. A value of y may be adjusted based on a prediction precision requirement. Each neural network includes one or more neurons, and quantities of neurons included in different neural networks may be the same or may be different. Neurons included in a first neural network may be represented as $S_{11}$, $S_{12}$, $S_{13}$ . . . . Neurons included in a second neural network may be represented as $S_{21}$, $S_{22}$, $S_{23}$ . . . . Neurons included in a $y^{th}$ neural network may be represented as $S_{y1}$, $S_{y2}$, $S_{y3}$ . . . . There may be or may not be a connection line between any two neurons included at the hidden layer. Each connection line has a weight, and a weight of an $i^{th}$ connection line may be represented as wi. i≥1, and i is an integer. In an example, when a storage device is started, initial values may be assigned to parameters such as y, wi, and a quantity of neurons included in each neural network. The assigned initial values may be obtained by training and verifying stored data (for example, a large amount of stored data) by using an offline machine based on a specific prediction precision requirement. In addition, in a data storage process, online learning may be selectively enabled based on an actual service requirement, so as to adjust a value or values of one or more parameters in y, wi, the quantity of neurons included in each neural network, and the like, thereby improving prediction precision.

The output layer 33 is configured to output the prediction result of the hidden layer 32 directly or after processing. A function of the processing is to obtain information that can be identified by a component/module that receives the prediction result. The prediction result includes predicted data obtained after the to-be-predicted data is predicted.

In an embodiment of this disclosure, a type of the AI neural algorithm may include any one of the following: an NLMS type, an SLP type, an MLP type, an RNN type, or the like. An AI neural algorithm of the RNN type may include a rapid and accurate image super-resolution (RAISR) algorithm of Google or an object moving track prediction technology and algorithm in intelligent driving, for example, an Apollo intelligent driving algorithm of Baidu. The following briefly describes the two algorithms to describe application examples of the AI neural algorithm.

The RAISR algorithm of Google may be described as follows: An intrinsic rule of a change of an image is obtained by learning the image by using a machine, where the intrinsic rule may be represented by using a value of a parameter (for example, one or more of the foregoing y, wi, and quantity of neurons included in each neural network) in the algorithm. Then, a pixel value that is of each missing pixel in the image and that is in an original high-resolution image is predicted by using the obtained value of the parameter and a known pixel value in the image, so as to restore a low-resolution image to a high-resolution image. For a computer, if a group of binary data in the computer has a missing part, a function of the RAISR algorithm of Google is to predict the missing part through machine learning.

The Apollo intelligent driving algorithm of Baidu may be described as follows: A motion parameter of an object is learned by using a machine, to obtain an intrinsic rule of a change of the motion parameter of the object, where the intrinsic rule may be represented by using a value of a parameter (for example, one or more of the foregoing y, wi, and quantity of neurons included in each neural network) in the algorithm. Then, a future motion parameter of the object is predicted by using the obtained value of the parameter and a current motion parameter and/or a historical motion parameter of the object. For a computer, a change of a position or a change of a specific value is predicted for a group of known binary data in future binary data.

By analogy, the AI neural algorithm used in the embodiments of this disclosure may be described as follows: Stored data is learned by using a machine, to obtain an intrinsic rule of a change of the stored data, where the intrinsic rule may be represented by using a value of a parameter (for example, one or more of the foregoing y, wi, and quantity of neurons included in each neural network) in the algorithm. Then, unknown stored data is predicted by using the obtained value of the parameter and known stored data. For a computer, a group of known binary data is used to predict a value of future binary data.

(2) Dictionary Compression Technology (or Algorithm) and Dictionary Decompression Technology (or Algorithm)

The dictionary compression technology is a high efficiency storage technology recognized in the industry currently. A basic principle of the dictionary compression technology is as follows: A dictionary is pre-stored on a storage device, where the dictionary includes at least two mapping relationships, each mapping relationship is a mapping relationship between one piece of first data and one piece of second data, and storage space occupied by the first data in each mapping relationship is larger than storage space occupied by the second data in the mapping relationship. In other words, each mapping relationship is a mapping relationship between a complex symbol (or complex data) and a simple symbol (or simple data). Generally, any two pieces of first data in the dictionary are different, and any two pieces of second data are different. When there is to-be-compressed data (for example, to-be-written data) that needs to be compressed, the storage device may compare the to-be-compressed data with first data in the dictionary, and if the first data in the dictionary includes the to-be-compressed data, store second data corresponding to the to-be-compressed data, or if the first data in the dictionary does not include the to-be-compressed data, store the to-be-compressed data.

For example, it is assumed that a correspondence between first data and second data stored in the dictionary is shown in Table 1.

TABLE 1

| First data | Second data |
| --- | --- |
| Chinese | 00 |
| People | 01 |
| China | 02 |

In addition, if the following to-be-compressed data needs to be compressed: "Chinese people, from China", after dictionary compression is performed based on the dictionary shown in Table 1, information (that is, information used to restore the to-be-compressed data) stored on the storage device may be "00 01, from 02".

A basic principle of the dictionary decompression technology is as follows: A storage device compares to-be-decompressed data (for example, data read from storage space) with second data in a dictionary, and if the second data in the dictionary includes the to-be-decompressed data, uses first data corresponding to the to-be-decompressed data as decompressed data, or if the second data in the dictionary does not include the to-be-decompressed data, uses the to-be-decompressed data as decompressed data.

In addition, the term "a plurality of" in this disclosure means two or more than two. The term "and/or" in this disclosure describes only an association relationship for describing associated objects and represents that three relationships may exist. For example, A and/or B may represent the following three cases: Only A exists, both A and B exist, and only B exists. In addition, the character "/" in this specification usually indicates an "or" relationship between the associated objects. When the character "/" is used in a formula, the character usually indicates a "division" relationship between the associated objects. For example, a formula A/B indicates that A is divided by B. In this disclosure, the terms "first", "second", and so on are intended to distinguish between different objects but do not indicate a particular order of the objects.

With reference to the accompanying drawings, the following describes a data storage method and a data obtaining method provided in the embodiments of this disclosure.

Figure 5:
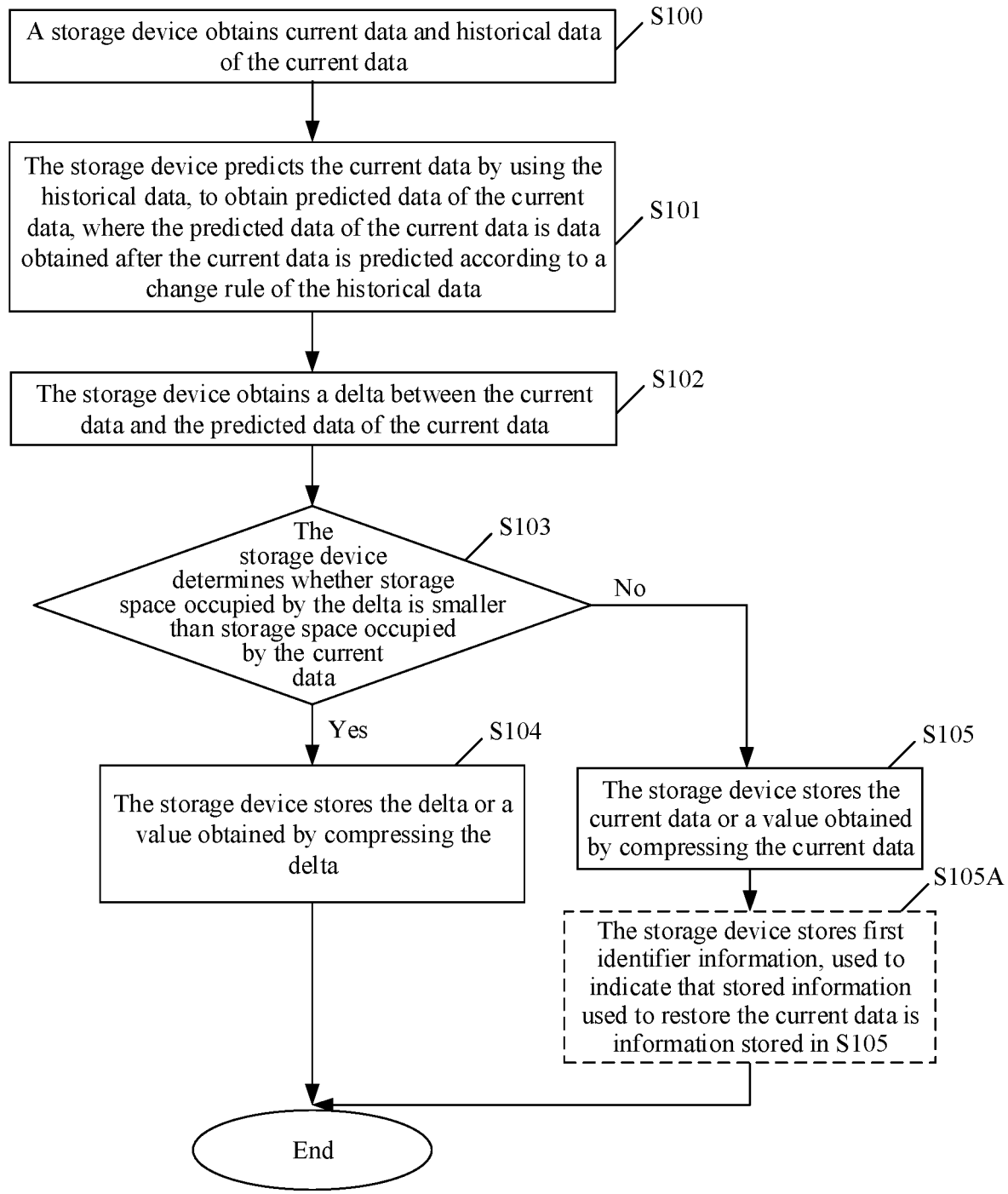
FIG. 5 is a schematic diagram 1 of a data storage method according to an embodiment of this disclosure.

FIG. 5 is a schematic diagram of a data storage method according to an embodiment of this disclosure. The method shown in FIG. 5 may include the following operations.

S100. A storage device obtains current data and historical data of the current data.

For example, the storage device obtains current data (namely, current to-be-stored data) in at least two pieces of to-be-stored data and historical data (namely, historical to-be-stored data) of the current data, and the historical data is one or more pieces of data before the current data in a sequence including the at least two pieces of to-be-stored data.

S101. The storage device predicts the current data by using the historical data, to obtain predicted data of the current data. The predicted data of the current data is data obtained after the current data is predicted according to a change rule of the historical data.

The change rule of the historical data is a change rule of content or a value of the historical data.

For example, it is assumed that all pieces of data (namely, to-be-stored data) in the sequence are successively $X(1)$, $X(2), X(3), \ldots, X(n), \ldots,$ and $X(N)$, where $1 \leq n \leq N$, $N \geq 2$, and both n and N are integers. In this case, when the current data is $X(n)$, the historical data may be any one or more pieces of data before $X(n)$. In an embodiment, the historical data is a preset quantity of pieces of consecutive data starting from $X(n-1)$ and before $X(n-1)$. For example, if the preset quantity is 10, when n=50, the historical data may be data $X(40)$ to $X(49)$, or when n=51, the historical data may be data $X(41)$ to $X(50)$. Certainly, the historical data is alternatively a plurality of pieces of non-consecutive data starting from $X(n-1)$ and before $X(n-1)$.

Specific data that is before the current data and that is used as the historical data of the current data may be related to an algorithm used to perform the prediction in S101. The algorithm used to perform the prediction is not limited in this embodiment of this disclosure. For example, the algorithm may include an AI neural algorithm. In this case, the specific data that is before the current data and that is used as the historical data used in S101 may be determined based on an input variable of the AI neural algorithm shown in FIG. 4. For example, if the input variable of the AI neural algorithm shown in FIG. 4 is 10 pieces of consecutive data starting from $X(n-1)$ and before $X(n-1)$, when the current data is $X(n)$ and n=50, the historical data is $X(40)$ to $X(49)$. For another example, if the input variable of the AI neural algorithm shown in FIG. 4 is $X(n-2), X(n-4), X(n-6), X(n-8),$ and $X(n-10)$, when the current data is $X(n)$ and n=50, the historical data is $X(48), X(46), X(44), X(42),$ and $X(40)$.

For specific implementation of the AI neural algorithm, refer to the foregoing description. Details are not described herein again. It should be noted that before performing S101, the storage device has obtained values of all parameters (for example, the foregoing y, wi, and quantity of neurons included in each neural network) of the AI neural algorithm. The values of all the parameters of the AI neural algorithm may be obtained by training stored data offline and/or online. When performing S101, the storage device may predict the current data based on the historical data and the obtained values of all the parameters of the AI neural algorithm, to obtain the predicted data of the current data.

In an example, after receiving one or more write requests sent by a client, the storage device may obtain the at least two pieces of to-be-stored data based on to-be-written data carried in the one or more write requests. The to-be-written data carried in the one or more write requests is data for a same subject or subjects of a same type. For example, the subjects may be a same article, a same image, or a plurality of images of a same type. Then, the at least two pieces of to-be-stored data are sorted to obtain the sequence including the at least two pieces of to-be-stored data. Subsequently, some or all pieces of to-be-stored data in the sequence are used as the current data to perform S101 to S105.

The obtaining the at least two pieces of to-be-stored data based on to-be-written data carried in the one or more write requests may include: using each piece of to-be-written data carried in the one or more write requests as one piece of to-be-stored data, or recombining and/or dividing the to-bewritten data carried in the one or more write requests into the at least two pieces of to-be-stored data. In an embodiment, a granularity of the to-be-written data received by the storage device may be the same as or different from a granularity of processing (including one or more of prediction, delta calculation, storage, and the like) by the storage device. For example, if each piece of to-be-written data included in the one or more write requests has 8 bits, when each piece of to-be-stored data has 8 bits, each piece of to-be-written data is one piece of to-be-stored data; when each piece of to-be-stored data has 16 bits, each piece of to-be-stored data may be obtained by combining two pieces of to-be-written data; or when each piece of to-be-stored data has 4 bits, every two pieces of to-be-stored data may be obtained by dividing one piece of to-be-written data. For ease of description, the following uses an example in which each piece of to-be-written data is used as one piece of to-be-stored data for description.

A specific manner of sorting the at least two pieces of to-be-stored data in this example is not limited in this embodiment of this disclosure. Usually, in this example, a sorting rule used to perform sorting is related to a prediction algorithm such as the AI neural algorithm used to perform prediction. For example, in this example, the sorting rule used to perform sorting is the same as a sorting rule on which the stored data is based when the stored data participates in training in a process in which the storage device obtains the values of all the parameters (the foregoing y, wi, quantity of neurons included in each neural network, and the like) of the AI neural algorithm. For example, if the stored data is for a same article when the stored data participates in training, the sorting rule may be a sequence of all characters in the article or a reverse sequence of the sequence. For another example, if the stored data participating in training is for a same image, the sorting rule may be a rule in which all pixels in the image are sorted row by row or column by column, or a rule in which the image is divided into a plurality of parts, and all pixels in a new image obtained after similar parts are combined are sorted row by row or column by column.

In an embodiment, after receiving one or more write requests sent by a client, the storage device may obtain the at least two pieces of to-be-stored data from to-be-written data carried in the one or more write requests, use a sequence constituted by the to-be-written data in order as the sequence including the at least two pieces of to-be-stored data, and then use some or all pieces of to-be-stored data in the sequence as the current data to perform S101 to S105. In this example, the storage device may not perform an operation of sorting the to-be-stored data. An application scenario of this example may be as follows: In a process in which the storage device obtains the values of all the parameters (for example, the foregoing y, wi, and quantity of neurons included in each neural network) of the AI neural algorithm, a sequence of the stored data participating in training is a sequence of the to-be-stored data that is received by the storage device and sent by the client. For explanations and implementations of the related parameters in this example, refer to the foregoing description.

It should be noted that, for the prediction operation, the following technical solutions are supported in an embodiment of this disclosure.

Solution 1: For some to-be-stored data, the prediction operation may be default. For example, if the historical data is 10 pieces of consecutive data starting from $X(n-1)$ and before $X(n-1)$, for first to tenth pieces of to-be-stored data, the prediction operation may be default.

Based on the solution 1, the storage device may store the to-be-stored data according to a technical solution provided in the prior art, for example, directly store the to-be-stored data, or store the to-be-stored data after performing compression based on an algorithm such as a dictionary compression algorithm and/or a deduplication algorithm. It may be understood that, in this case, S102 to S104 may also be default.

Solution 2: When the storage device predicts different to-be-stored data, all parameters of a used prediction algorithm may be the same or may be different. For example, for fifth to tenth pieces of to-be-stored data, the input variable of the AI neural algorithm may be five pieces of consecutive data starting from $X(n-1)$ and before $X(n-1)$, in other words, there are five input variables. For the tenth piece of to-be-stored data and subsequent to-be-stored data, the input variable of the AI neural algorithm may be 10 pieces of consecutive data starting from $X(n-1)$ and before $X(n-1)$, in other words, there are ten input variables.

S102. The storage device obtains a delta between the current data and the predicted data of the current data.

The delta is a parameter used to represent a difference between the current data and the predicted data of the current data. For example, the delta may be a difference, a ratio, a multiple, a percentage, or the like. Certainly, this embodiment of this disclosure is not limited thereto.

For example, if the delta is a difference, the difference may be a difference obtained by subtracting the predicted data of the current data from the current data, or a difference obtained by subtracting the current data from the predicted data of the current data. A specific difference may be predefined, and this embodiment of this disclosure is not limited thereto. It may be understood that because the predicted data of the current data may be greater than, equal to, or less than the current data, the difference may be a value greater than, equal to, or less than 0. When the delta is a ratio, a multiple, a percentage, or the like, principles of a specific implementation and a value of the delta are similar to those described above, and are not enumerated one by one herein.

S103. The storage device determines whether storage space occupied by the delta is smaller than storage space occupied by the current data. If the storage space occupied by the delta is smaller than the storage space occupied by the current data, S104 is performed. If the storage space occupied by the delta is not smaller than the storage space occupied by the current data, S105 is performed.

S103 may be implemented in one of the following manners.

Manner 1: The storage device determines whether a quantity of bits of the delta is less than a quantity of bits of the current data.

Manner 2: The storage device separately compresses the delta and the current data (for example, compresses the delta and the current data by using a dictionary compression algorithm or a deduplication algorithm), and determines whether a quantity of bits of a value obtained by compressing the delta is less than a quantity of bits of a value obtained by compressing the current data.

Based on either of Manner 1 and Manner 2, if a determining result is "yes", it indicates that the storage space occupied by the delta is smaller than the storage space occupied by the current data; or if a determining result is "no", it indicates that the storage space occupied by the delta is larger than or equal to the storage space occupied by the current data.

S104. The storage device stores the delta or stores the value obtained by compressing the delta. Whether the value obtained by compressing the delta or the delta is stored may be predefined. Certainly, this embodiment of this disclosure is not limited thereto.

A compression algorithm used to perform compression is not limited in this embodiment of this disclosure. For example, the compression algorithm may include at least one of a dictionary compression algorithm and a deduplication algorithm. A specific used algorithm or specific used algorithms may be predefined. Certainly, this embodiment of this disclosure is not limited thereto.

After S104 is performed, a storing process for the current data ends.

S105. The storage device stores the current data or stores the value obtained by compressing the current data. Whether the value obtained by compressing the current data or the current data is stored may be predefined. Certainly, this embodiment of this disclosure is not limited thereto.

In an embodiment, when S105 is performed, a compression algorithm used by the storage device is consistent with the compression algorithm used for the compression in S104. Certainly, this embodiment of this disclosure is not limited thereto.

After S105 is performed, a storing process for the current data ends.

To help the storage device distinguish whether stored information used to restore the current data is "the value obtained through compression or the delta" or "the value obtained through compression or the current data", so as to determine to-be-read data in a data read procedure, in an embodiment, if S105 is performed, the method may further include the following S105A.

S105A. The storage device stores first identifier information, where the first identifier information is used to indicate that the stored information used to restore the current data is information (namely, the current data or the value obtained by compressing the current data) stored in S105. The first identifier information may be used as identifier information of the information used to restore the current data, or as information carried in the information used to restore the current data.

It may be understood that S105A may be replaced with the following: The following S104A is performed after S104 is performed. Alternatively, if S105A is performed, after S104 is performed, the following S104A may be further performed.

S104A. The storage device stores second identifier information, where the second identifier information is used to indicate that the stored information used to restore the current data is information (namely, the delta or the value obtained by compressing the delta) stored in S104.

Predicted data of the to-be-stored data can be close to the to-be-stored data by adjusting a value of a parameter of a prediction algorithm, so that storage space occupied by a delta between predicted data of each of most pieces of to-be-stored data and the to-be-stored data is smaller than storage space occupied by the to-be-stored data. Therefore, in specific implementation, if S105A is performed and S104A is not performed (in other words, the first identifier information is stored and the second identifier information is not stored), the storage device can distinguish whether the stored information used to restore the current data is "the value obtained by compressing the delta or the delta" or "the value obtained by compressing the current data or the current data", and storage overheads can be reduced. Embodiments shown in the following FIG. 6-1 to FIG. 6-4 to FIG. 8A to FIG. 8C are all described based on an example in which S105A is performed and S104A is not performed in the data storage method.

In the data storage method provided in an embodiment of this disclosure, the current data is predicted by using the historical data, and when the storage space occupied by the delta between the current data and the predicted data of the current data is smaller than the storage space occupied by the current data, the delta or the value obtained by compressing the delta is stored. Because the storage space occupied by the delta is smaller than the storage space occupied by the current data, a process of prediction and delta calculation may be considered as a data compression process. In this way, compared with that in the prior art, regardless of whether the delta is directly stored or the value obtained by compressing the delta is stored, storage overheads can be reduced. In addition, a proper prediction algorithm is used or a parameter in the prediction algorithm is adjusted, so that the predicted data of the current data is close to the current data. Therefore, the storage space occupied by the delta is far smaller than the storage space occupied by the current data, thereby more effectively reducing storage overheads. In addition, storage overheads can be further reduced in a technical solution of storing the value obtained by compressing the delta.

The technical solution of storing the value obtained by compressing the delta that is shown in FIG. 5 may be understood as follows: A prediction algorithm is introduced before data is processed by using a conventional compression algorithm, where the prediction algorithm is constructed based on a content rule, a development trend, an intrinsic relationship, and the like of the data. Content of data to be input into the storage device is predicted by using the prediction algorithm and data that has been input into the storage device (or latter data in a sequence including a plurality of pieces of data that have been input into the storage device is predicted by using previous data). Then, for predicted accurate content or similar content, only the conventional data compression algorithm is invoked to compress a delta between an actual value and a predicted value, but the predicted accurate content or similar content is not stored. In this way, a compression rate is increased, and a fluctuation range of an input value in the conventional compression algorithm is actively reduced, thereby achieving optimization and breakthrough of the current compression algorithm in terms of a decompression rate and a decompression speed.

For example, for a storage device end, although a storage object is a binary sequence, when the sequence is restored to understandable semantics, it is found that the sequence contains some change rules. For example, after a binary sequence Xn={10, 101, 1010, 10001, 11010, 100101, 110010, 1000001, 1010010, 1100101, 1111010, 10010001, 10101011} is converted into a decimal sequence, Xn'={2, 5, 10, 17, 26, 37, 50, 65, 82, 101, 122, 145, 171} is obtained. It is found through analysis that first 12 pieces of data in Xn' meet the following change rule: $x^2+1$ and x=1 to 12.

Based on this, for Xn', a sequence actually stored by the storage device based on the prediction algorithm $x^2+1$ and the embodiment shown in FIG. 5 may be {10, 101, 1010, 0, 0, 0, 0, 0, 0, 0, 0, 0, 01}. For first three pieces of data in Xn', the prediction operation is default. With reference to S105A, it may be learned that for the three pieces of data, the storage device may further separately store first identifier information. The stored "01" is a difference between the to-be-stored data 171 and predicted data 170 of the to-be-stored data. It can be learned that a range of data that needs to be compressed for storage is significantly reduced, and a repetition probability of the data in the range apparently increases. Therefore, a data compression ratio and compression efficiency can be significantly improved.

It should be noted that, for a plurality of pieces of to-be-stored data, because each piece of to-be-stored data may be stored according to the data storage method shown in FIG. 5, when each piece of to-be-stored data is compared with predicted data of the to-be-stored data, one of the following cases may occur: completely the same, partially the same, and completely different. In the case in which the to-be-stored data and the predicted data are completely the same or partially the same, storage space can be saved. In the case in which the to-be-stored data and the predicted data are completely different, an effect is equivalent to that of a corresponding method used in the prior art. Therefore, in general, storage space can be saved. In addition, in the technical solution of storing the value obtained through compression, a data compression ratio and compression efficiency can be significantly improved.

Figure 5A:
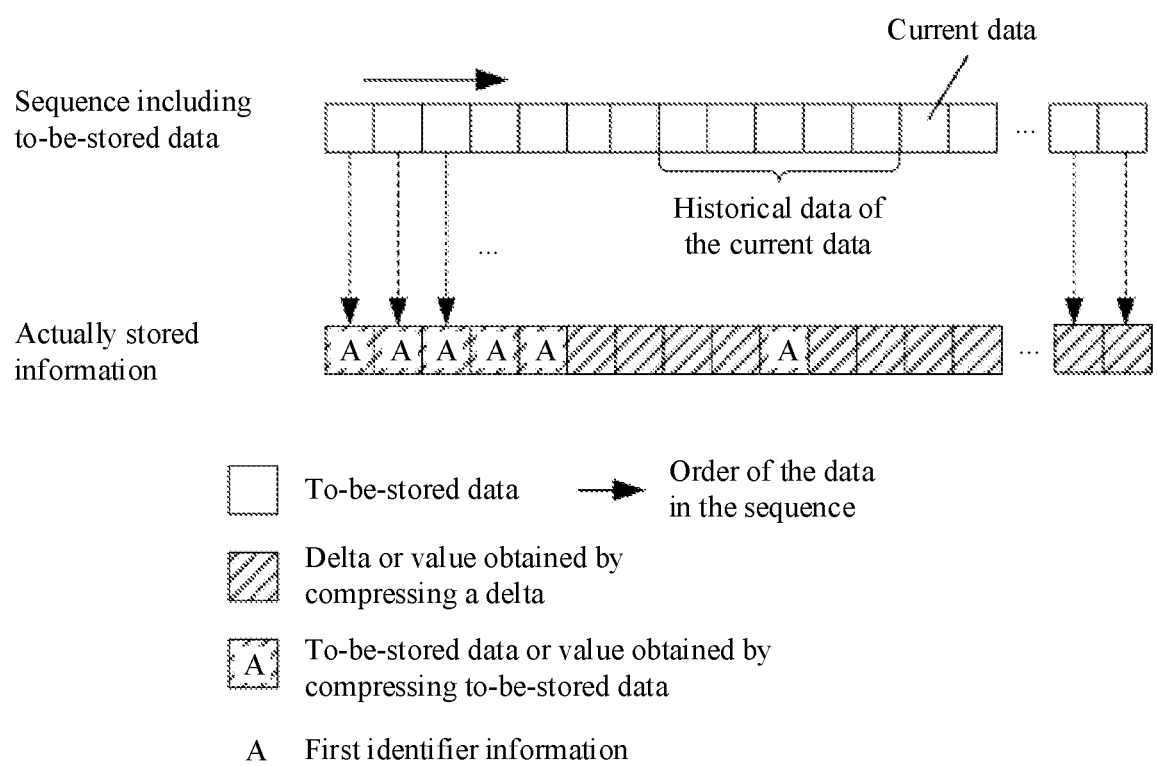
FIG. 5A is a schematic diagram of to-be-stored data and actually stored information according to an embodiment of this disclosure.

FIG. 5A is a schematic diagram of to-be-stored data and actually stored information (that is, information used to restore to-be-stored data) according to an embodiment of this disclosure. An example in which historical data is five pieces of consecutive to-be-stored data before current data and starting from a piece of to-be-stored data before the current data is used for description in FIG. 5. Therefore, for first five pieces of to-be-stored data in a sequence, corresponding actually stored information is separately to-be-stored data (or a value obtained by compressing to-be-stored data) and first identifier information. Each shadow square represents actually stored information corresponding to one piece of to-be-stored data, and a correspondence is shown by a dashed-line arrow. "A" indicates the first identifier information.

Figures 1, 6:
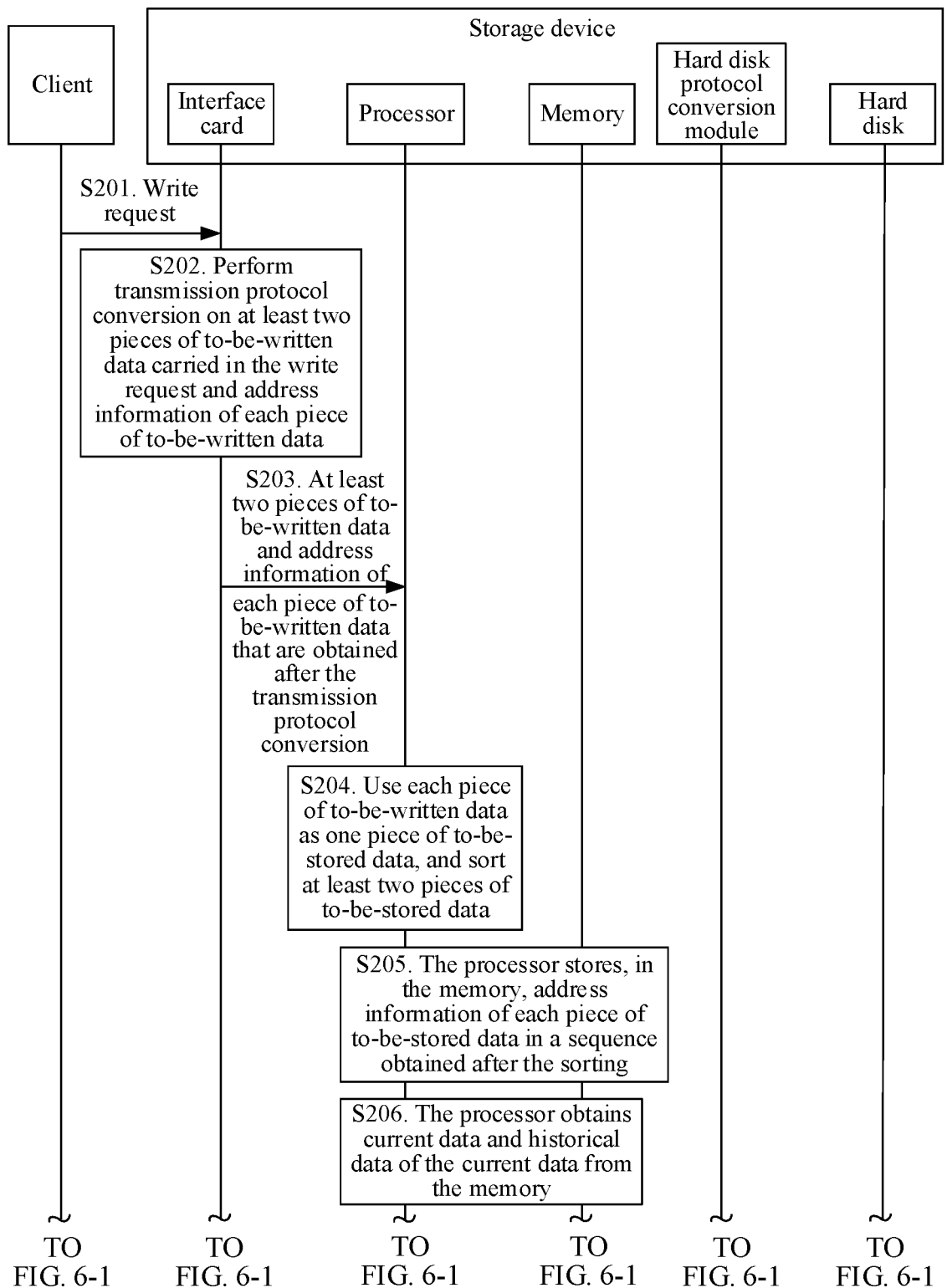
Figures 2, 6:
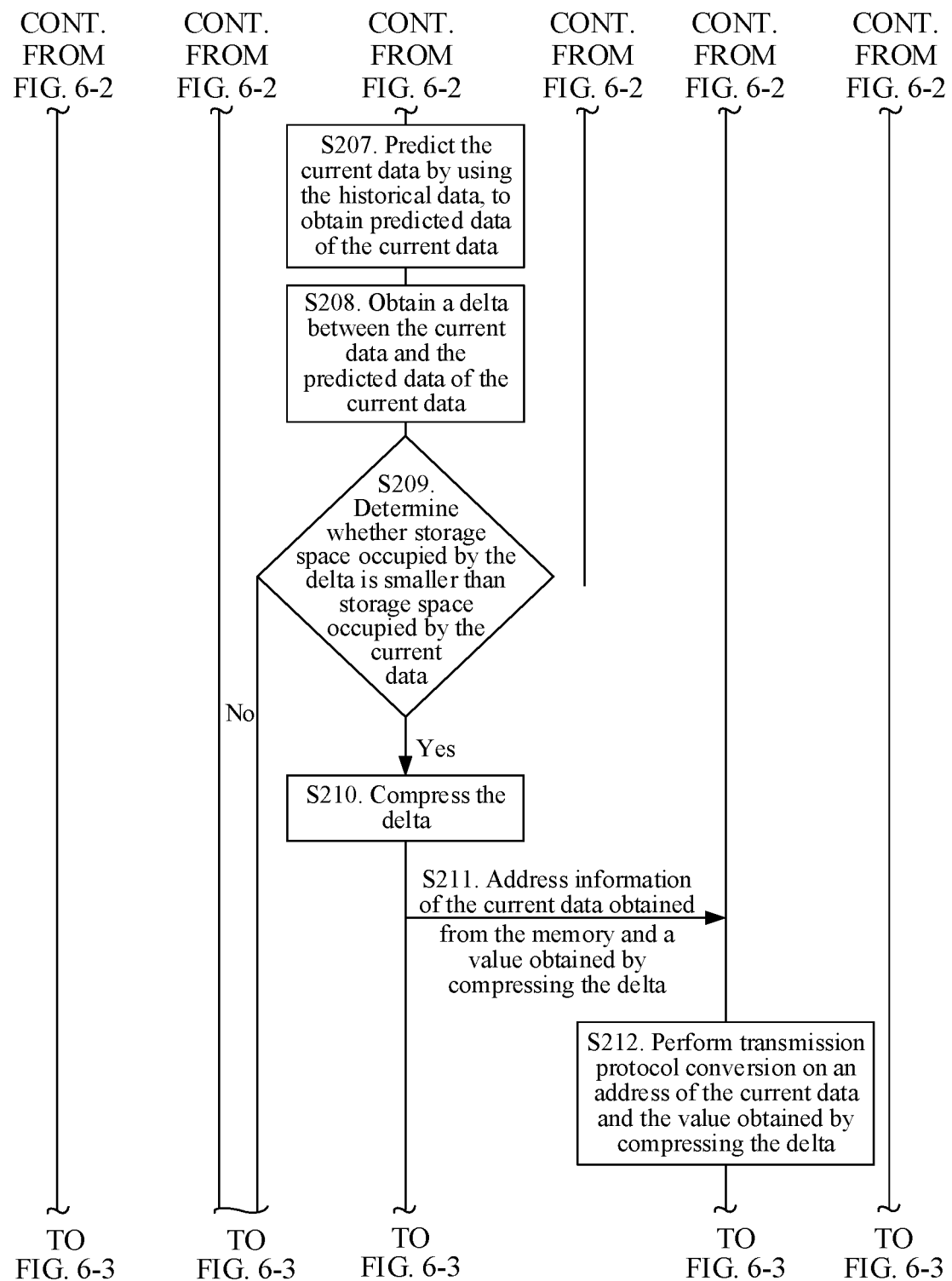
Figures 3, 6:
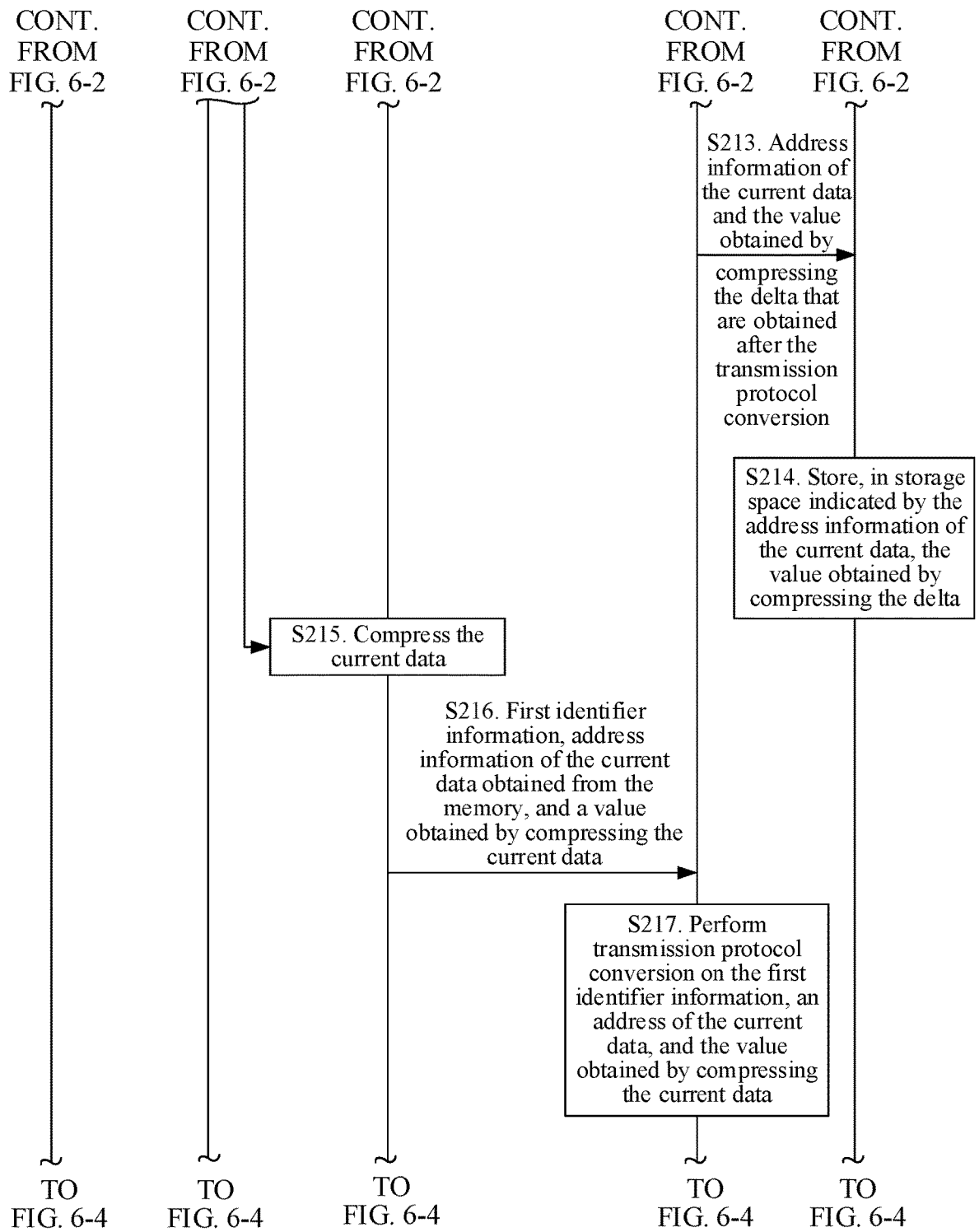
Figures 4, 6:
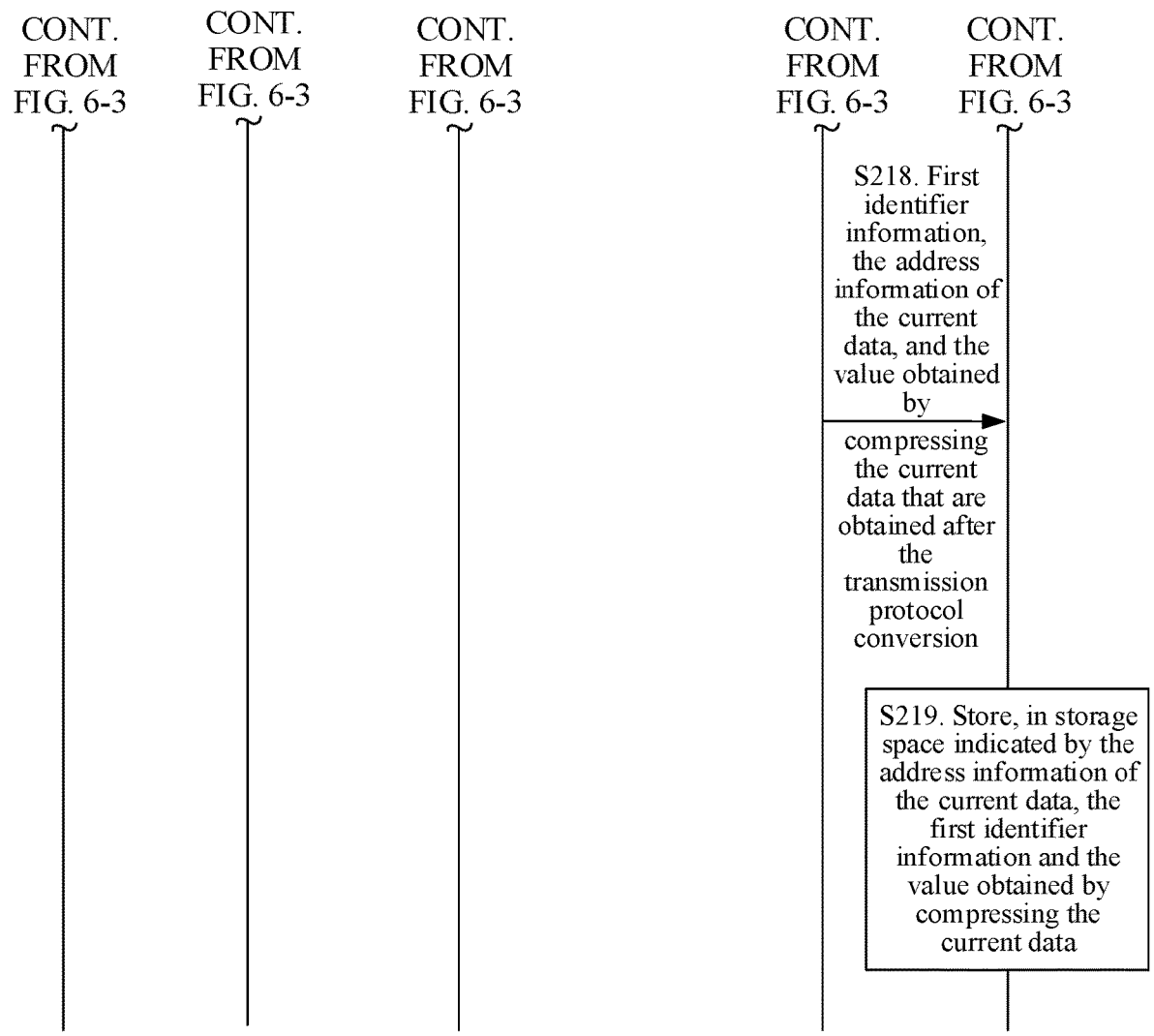

With reference to the storage device 200 shown in FIG. 2, an example of the data storage method shown in FIG. 5 may be shown in FIG. 6-1 to FIG. 6-4. A method shown in FIG. 6-1 to FIG. 6-4 may include the following operations.

S201. A storage device receives, by using an interface card, a write request sent by a client, where the write request includes at least two pieces of to-be-written data and address information of each of the at least two pieces of to-be-written data.

S202. The interface card performs transmission protocol conversion on the at least two pieces of to-be-written data and the address information of each piece of to-be-written data, for example, converts these pieces of information that use an Ethernet communication protocol into information that uses a PCIE protocol.

S203. The interface card sends, to a processor, the at least two pieces of to-be-written data and the address information of each piece of to-be-written data that are obtained after the transmission protocol conversion.

S204. The processor uses, as one piece of to-be-stored data, each of the at least two pieces of to-be-written data received from the interface card, and sorts at least two pieces of obtained to-be-stored data.

S205. The processor stores a sequence obtained after the sorting and address information of each piece of to-be-stored data (namely, each piece of to-be-written data) in memory. Subsequently, the processor may use some or all pieces of to-be-stored data in the sequence as current data to perform the following S206 to S219. It may be understood that, for any two pieces of to-be-stored data in the sequence, earlier to-be-stored data in the sequence may be used as historical data of later to-be-stored data.

In an embodiment, S204 and S205 may be replaced with the following: The processor uses, as one piece of to-be-stored data, each of the at least two pieces of to-be-written data received from the interface card, and writes the obtained to-be-stored data and address information of the to-be-stored data into memory. Then, the processor may sort at least two pieces of to-be-stored data written into the memory, or the processor may use an order of the at least two pieces of received to-be-written data sent by the interface card as an order of the at least two pieces of to-be-stored data to form a sequence, and use some or all pieces of to-be-stored data in the sequence as current data to perform the following S206 to S219.

It may be understood that, earlier to-be-stored data in the sequence may be used as historical data of later to-be-stored data. However, it can be learned based on the foregoing description that not all to-be-stored data before a piece of to-be-stored data is used as historical data of the piece of to-be-stored data. Based on this, in an embodiment, for any piece of to-be-stored data, the processor may delete the to-be-stored data from the memory when the to-be-stored data is no longer used as historical data of other to-be-stored data, so as to reduce storage overheads of the memory.

Figure 6A:
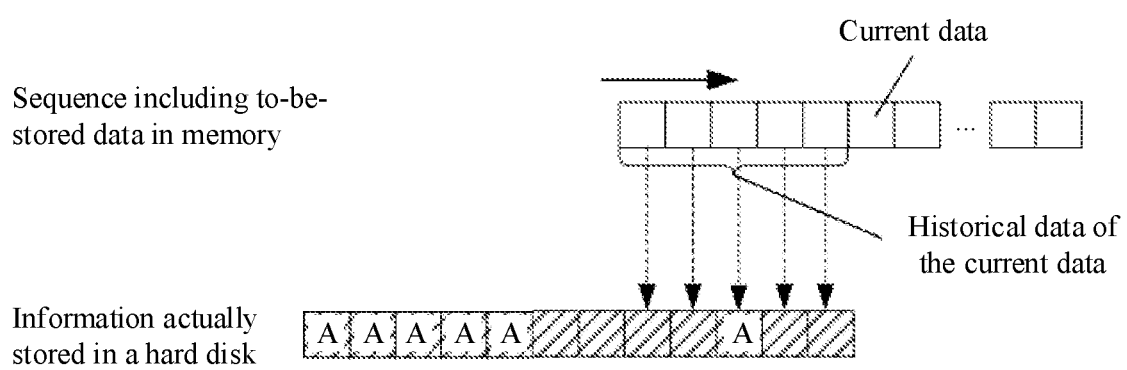
FIG. 6A is a schematic diagram of information stored in memory and a hard disk at a moment according to an embodiment of this disclosure.

FIG. 6A is a schematic diagram of information stored in memory and a hard disk at a moment. FIG. 6A is drawn based on FIG. 5A. Therefore, for explanations of various graphs, arrows, or the like in FIG. 6A, refer to FIG. 5A. It can be learned from FIG. 6A that, at a moment, a sequence including to-be-stored data in the memory may include only historical data of current data, the current data, and to-be-stored data after the current data. In this way, storage overheads of the memory can be reduced.

S206. The processor obtains the current data and historical data of the current data from the memory.

S207. The processor predicts the current data by using the historical data, to obtain predicted data of the current data.

S208. The processor obtains a delta between the current data and the predicted data of the current data.

S209. The processor determines whether storage space occupied by the delta is smaller than storage space occupied by the current data.

If the storage space occupied by the delta is smaller than the storage space occupied by the current data, S210 is performed, or if the storage space occupied by the delta is not smaller than the storage space occupied by the current data, S215 is performed.

S210. The processor compresses the delta.

S211. The processor sends, to a hard disk protocol conversion module, address information of the current data obtained from the memory and a value obtained by compressing the delta.

S212. The hard disk protocol conversion module performs transmission protocol conversion on the address information of the current data and the received value obtained by compressing the delta, for example, performs conversion from the PCIE protocol to a SAS protocol.

S213. The hard disk protocol conversion module sends, to a hard disk such as a SAS disk, the address information of the current data and the value obtained by compressing the delta that are obtained after the transmission protocol conversion.

S214. The hard disk stores, in storage space indicated by the address information of the current data, the value obtained by compressing the delta. After S214 is performed, a storing process for the current data ends.

S215. The processor compresses the current data.

S216. The processor sends, to a hard disk protocol conversion module, first identifier information, address information of the current data obtained from the memory, and a value obtained by compressing the current data. The first identifier information is used to indicate that stored information used to restore the current data is the value obtained by compressing the current data.

S217. The hard disk protocol conversion module performs transmission protocol conversion on the received first identifier information, the address information of the current data, and the value obtained by compressing the current data, for example, performs conversion from the PCIE protocol to a SAS protocol.

S218. The hard disk protocol conversion module sends, to a hard disk (such as a SAS disk), the first identifier information, the address information of the current data, and the value obtained by compressing the current data that are obtained after the transmission protocol conversion.

S219. The hard disk stores, in storage space indicated by the address information of the current data, the first identifier information and the value obtained by compressing the current data. After S219 is performed, a storing process for the current data ends.

With reference to the storage device shown in FIG. 3, an example of the data storage method shown in FIG. 5 may be an embodiment obtained after the embodiment shown in FIG. 6-1 to FIG. 6-4 is modified at the following several points: 1. The foregoing S207 to S209 are performed by an AI computing card. 2. After S206 is performed and before S207 is performed, the method further includes: the processor sends, to the AI computing card, the historical data and the current data obtained from the memory. 3. After S209 is performed and before S210 is performed, the method further includes: the AI computing card sends the delta to the processor. 4. After S209 is performed and before S215 is performed, the method further includes: the AI computing card sends the current data to the processor.

Figure 7:
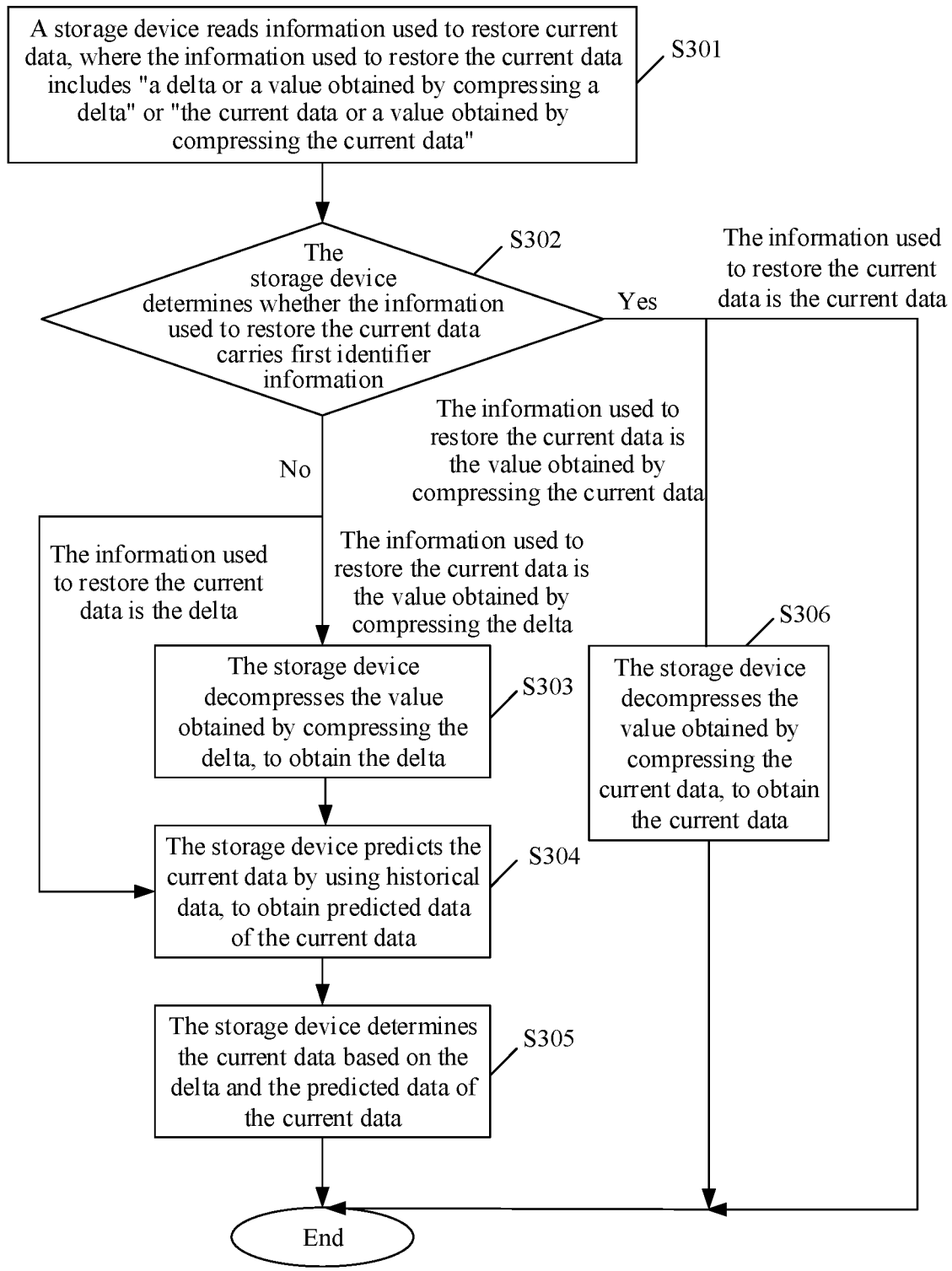
FIG. 7 is a schematic diagram 1 of a data obtaining method according to an embodiment of this disclosure.

FIG. 7 is a schematic diagram of a data obtaining method according to an embodiment of this disclosure. This embodiment corresponds to the data storage method shown in FIG. 5. Therefore, for an explanation of related content in this embodiment, refer to the embodiment shown in FIG. 5. The method shown in FIG. 7 may include the following operations.

S301. A storage device reads information used to restore current data (namely, current to-be-obtained data). The information used to restore the current data includes "a delta or a value obtained by compressing a delta" or "the current data or a value obtained by compressing the current data". The delta is a delta between the current data and predicted data of the current data. The predicted data of the current data is data obtained after the current data is predicted according to a change rule of historical data.

The historical data is one or more pieces of obtained data.

For example, after receiving one or more read requests sent by a client, the storage device may obtain address information of at least two pieces of to-be-obtained data based on to-be-read data requested by using the one or more read requests, and then read, based on the address information of the at least two pieces of to-be-obtained data, information used to restore the at least two pieces of to-be-obtained data. The data requested by using the one or more read requests is data for a same subject. For a related description of the subject, refer to the embodiment shown in FIG. 5. A granularity of the to-be-read data may be the same as or different from a granularity of the to-be-obtained data. For example, if one piece of to-be-read data has 8 bits, one piece of to-be-obtained data may have 4 bits, 8 bits, 16 bits, or the like. For ease of description, the following uses an example in which each piece of to-be-read data is one piece of to-be-obtained data for description. For a correspondence between to-be-read data and to-be-obtained data, refer to the foregoing correspondence between to-be-written data and to-be-stored data. Details are not described herein again. The storage device may use each of the at least two pieces of to-be-obtained data as the current data to perform S301 to S306.

If the information used to restore the current data includes "the delta or the value obtained by compressing the delta", whether the information includes the delta or the value obtained by compressing the delta may be predefined. Certainly, this disclosure is not limited thereto.

If the information used to restore the current data includes "the current data or the value obtained by compressing the current data", whether the information includes the current data or the value obtained by compressing the current data may be predefined. Certainly, this disclosure is not limited thereto.

S302. The storage device determines whether the information used to restore the current data carries first identifier information.

Based on the description in the embodiment shown in FIG. 5, the following can be learned.

If a determining result in S302 is that the information used to restore the current data does not carry the first identifier information, it indicates that the information used to restore the current data includes the delta or the value obtained by compressing the delta. Based on this, when the information used to restore the current data is the value obtained by compressing the delta, S303 is performed, or when the information used to restore the current data is the delta, S304 is performed.

If a determining result in S302 is that the information used to restore the current data carries the first identifier information, it indicates that the information used to restore the current data includes the current data or the value obtained by compressing the current data. Based on this, when the information used to restore the current data is the value obtained by compressing the current data, S306 is performed, or when the information used to restore the current data is the current data, an obtaining process for the current data ends.

S303. The storage device decompresses the value obtained by compressing the delta, to obtain the delta.

It may be understood that a decompression algorithm used to perform decompression in S303 corresponds to the compression algorithm used to perform compression in S104. For example, if a dictionary compression algorithm is used to perform compression in S104, a dictionary decompression algorithm is used to perform decompression in S303. For another example, if a deduplication algorithm is used to perform compression in S104, an inverse deduplication algorithm is used to perform decompression in S303.

S304. The storage device predicts the current data by using the historical data, to obtain the predicted data of the current data.

The historical data is the one or more pieces of data obtained by the storage device. Whether the historical data is one piece or more pieces of obtained data and which one piece or more pieces of data is the historical data are related to a prediction algorithm. For a specific implementation of the historical data, refer to the embodiment shown in FIG. 5. Details are not described herein again.

Figure 7A:
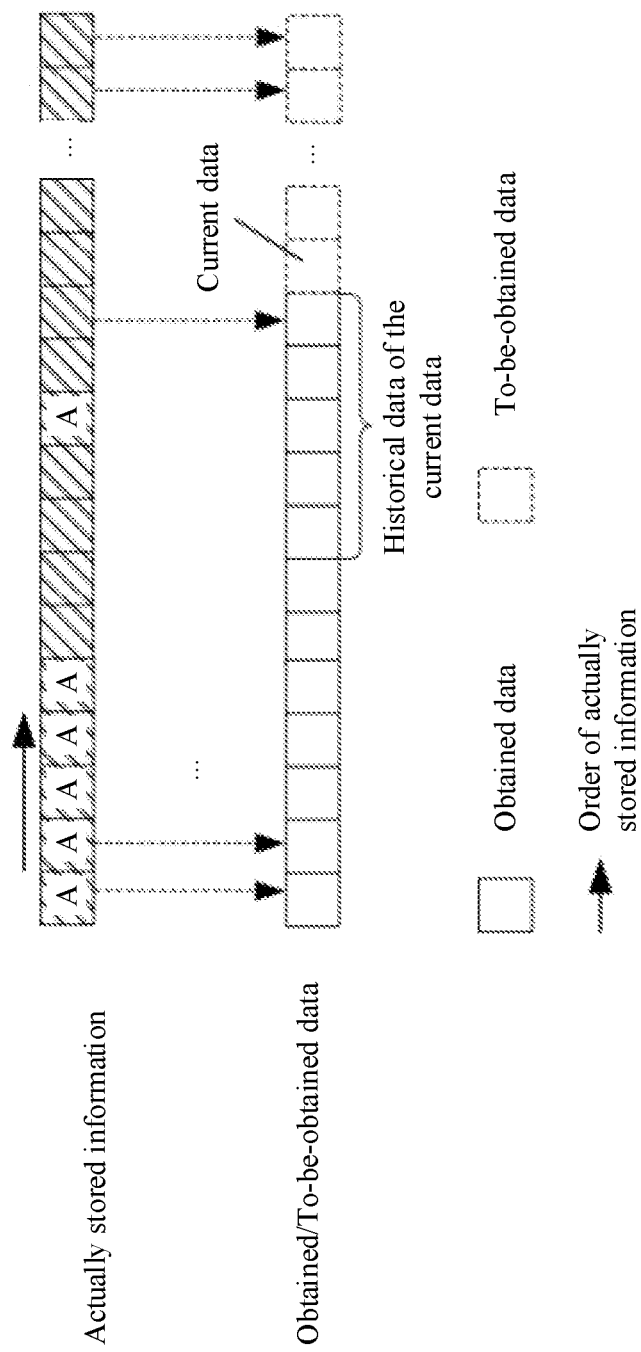
FIG. 7A is a schematic diagram of to-be-obtained data and actually stored information according to an embodiment of this disclosure.

FIG. 7A is a schematic diagram of to-be-obtained data and actually stored information (that is, information used to restore to-be-obtained data) according to an embodiment of this disclosure. The actually stored information in FIG. 7A is the same as the actually stored information shown in FIG. 5A. Therefore, for an explanation of a related graph, arrow, or the like, refer to FIG. 5A.

An execution sequence of S303 and S304 is not limited in this embodiment of this disclosure. For example, S303 may be performed before S304, S304 may be performed before S303, or S303 and S304 may be simultaneously performed.

S305. The storage device determines the current data based on the delta and the predicted data of the current data.

For example, if the delta is a difference obtained by subtracting the predicted data of the current data from the current data, in S305, a sum of the delta and the predicted data of the current data is used as the current data. For example, if the delta is a ratio obtained by dividing the current data by the predicted data of the current data, in S305, a product of the delta and the predicted data of the current data is used as the current data. Other examples are not enumerated one by one.

After S305 is performed, an obtaining process for the current data ends.

S306. The storage device decompresses the value obtained by compressing the current data, to obtain the current data.

After S306 is performed, an obtaining process for the current data ends.

The data obtaining method provided in this embodiment corresponds to the data storage method shown in FIG. 5. Therefore, for a beneficial effect in this embodiment, refer to the beneficial effect described in the embodiment shown in FIG. 5. Details are not described herein again.

Figure 8A:
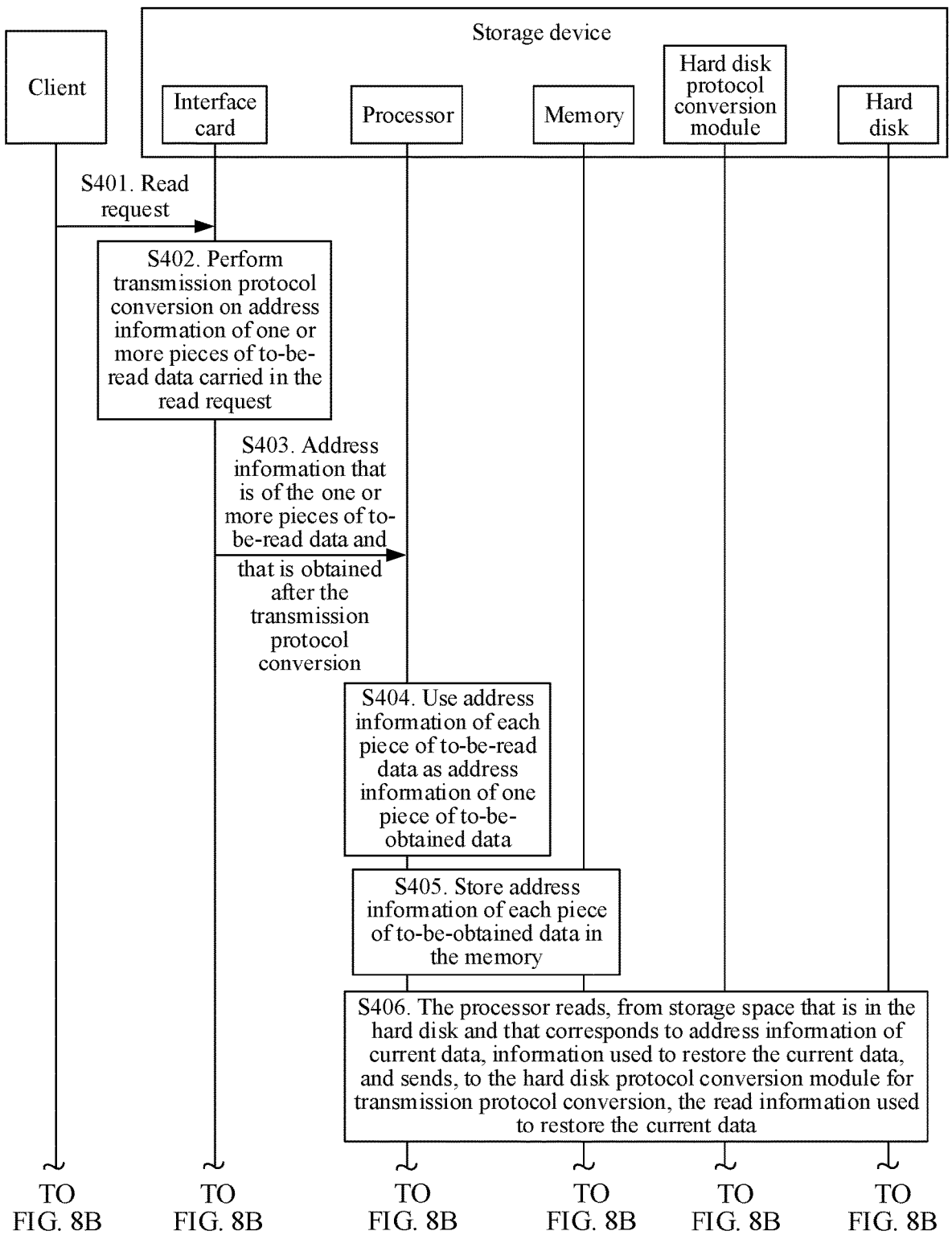
FIG. 8A to FIG. 8C are a schematic diagram 2 of a data obtaining method according to an embodiment of this disclosure.
Figure 8B:
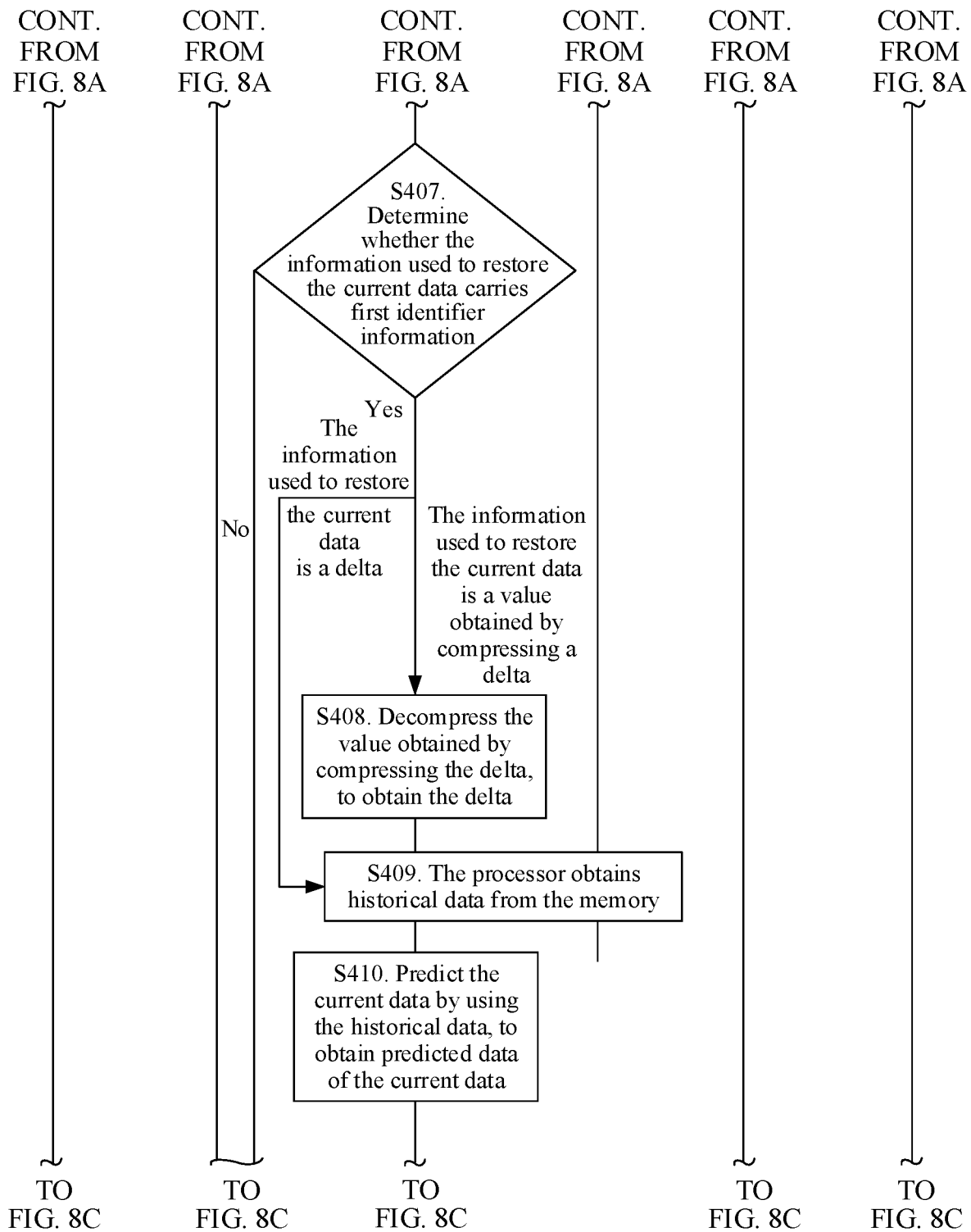
Figure 8C:
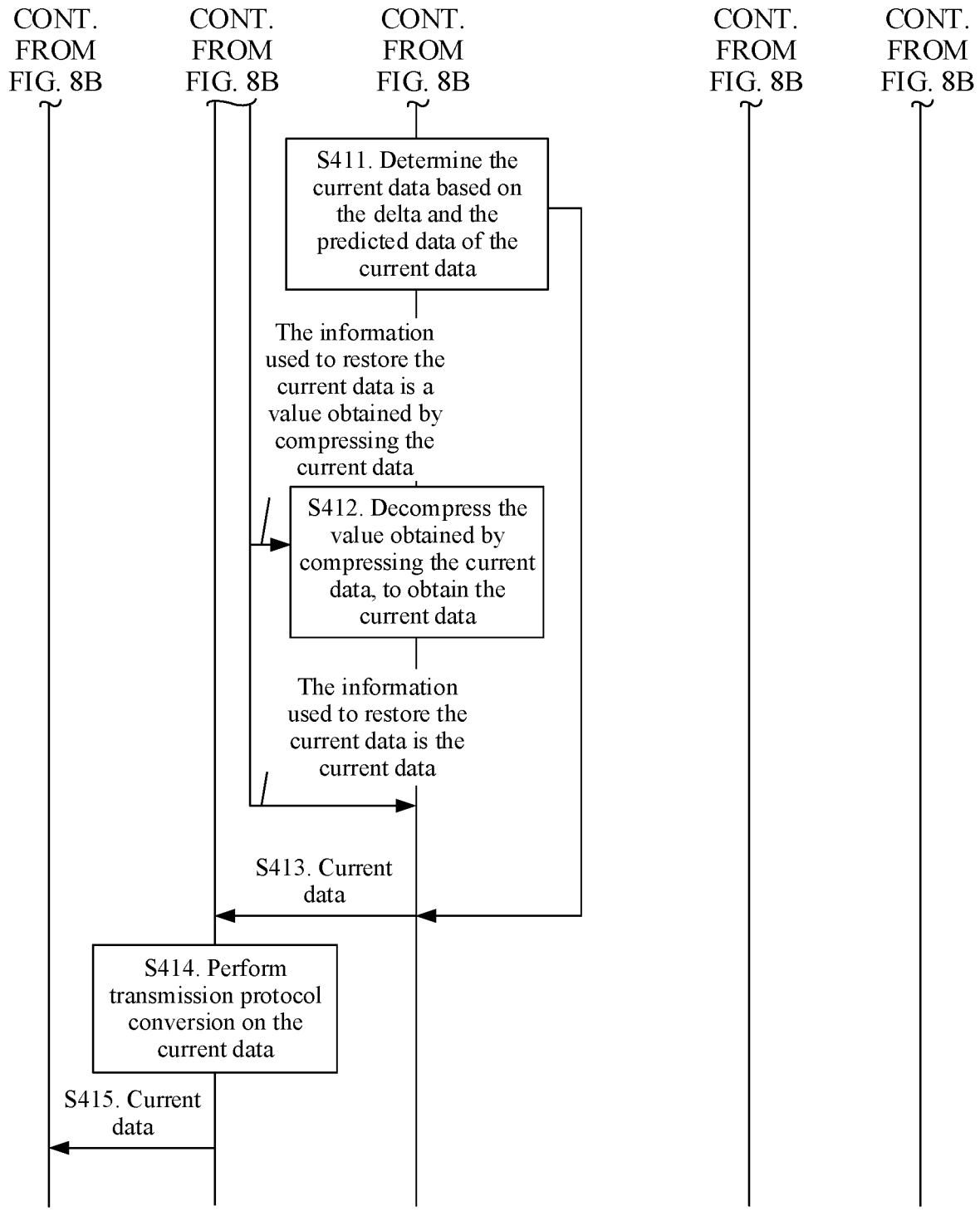

With reference to the storage device 200 shown in FIG. 2, an example of the data obtaining method shown in FIG. 7 may be shown in FIG. 8A to FIG. 8C. A method shown in FIG. 8A to FIG. 8C may include the following operations.

S401. A storage device receives, by using an interface card, a read request sent by a client, where the read request includes address information of one or more pieces of to-be-read data.

S402. The interface card performs transmission protocol conversion on the address information of the one or more pieces of to-be-read data, for example, converts the address information of the one or more pieces of to-be-read data that uses an Ethernet communication protocol into information that uses a PCIE protocol.

S403. The interface card sends, to a processor, the address information that is of the one or more pieces of to-be-read data and that is obtained after the transmission protocol conversion.

S404. The processor uses address information of each piece of to-be-read data in the received address information of the one or more pieces of to-be-read data as address information of one piece of to-be-obtained data.

S405. The processor stores address information of each piece of to-be-obtained data in memory.

Subsequently, the processor may use some or all pieces of to-be-obtained data as current data to perform S406 to S415. In addition, when obtaining each piece of current data, the processor may store the current data in the memory, so as to subsequently use the current data as historical data of other current data.

S406. The processor reads, from storage space that is in a hard disk and that is indicated by address information of the current data, information used to restore the current data, and sends, to a hard disk protocol conversion module for transmission protocol conversion, the read information used to restore the current data, for example, conversion from the information that is used to restore the current data and that uses a SAS protocol to information that uses the PCIE protocol.

S407. The processor determines whether the information used to restore the current data carries first identifier information.

If the information used to restore the current data does not carry the first identifier information, it indicates that the information used to restore the current data includes a delta or a value obtained by compressing a delta. Based on this, when the information used to restore the current data is the value obtained by compressing the delta, S408 is performed, or when the information used to restore the current data is the delta, S409 is performed.

If the information used to restore the current data carries the first identifier information, it indicates that the information used to restore the current data includes the current data or a value obtained by compressing the current data. Based on this, when the information used to restore the current data is the value obtained by compressing the current data, S412 is performed, or when the information used to restore the current data is the current data, S413 is performed.

S408. The processor decompresses the value obtained by compressing the delta, to obtain the delta.

S409. The processor obtains historical data from the memory.

S410. The processor predicts the current data by using the historical data, to obtain predicted data of the current data.

S411. The processor determines the current data based on the delta and the predicted data of the current data.

After S411 is performed, S413 is performed.

S412. The processor decompresses the value obtained by compressing the current data, to obtain the current data.

S413. The processor sends the current data to the interface card.

In an embodiment, the processor may further store the current data in the memory, so as to use the current data as historical data of other to-be-obtained data. Further, in an embodiment, when obtained data is no longer used as historical data of to-be-obtained data, the processor may delete the obtained data from the memory, so as to reduce storage overheads of the memory. For example, if the current data is X(n), and the historical data is 10 pieces of consecutive data (namely, X(n−10) to X(n−1)) starting from X(n−1) and before X(n−1), X(n−11) and data before X(n−11) are no longer used as historical data of to-be-obtained data. Therefore, the processor may delete the obtained data from the memory.

S414. The interface card performs transmission protocol conversion on the current data, for example, conversion from the PCIE protocol to the Ethernet communication protocol.

S415. The interface card feeds back the current data using the Ethernet communication protocol to the client.

In this way, an obtaining process for the current data ends.

With reference to the storage device shown in FIG. 3, an example of the data obtaining method shown in FIG. 7 may be an embodiment obtained after the embodiment shown in FIG. 8A to FIG. 8C is modified at the following several points: 1. The foregoing S410 and S411 are performed by an AI computing card. 2. After S409 is performed and before S410 is performed, the method further includes: the processor sends, to the AI computing card, the historical data obtained from the memory. 3. After S411 is performed and before S413 is performed, the method further includes: the AI computing card sends the current data to the processor.

Currently, all mapping relationships in a dictionary of a dictionary compression (or decompression) algorithm are arranged in descending order of hit rates. Usually, when to-be-compressed data needs to be compressed, the to-be-compressed data is searched in first data in the dictionary in descending order of the hit rates of the mapping relationships, and second data corresponding to the to-be-compressed data is used as a value obtained after compressing the to-be-compressed data. When to-be-decompressed data needs to be decompressed, the to-be-decompressed data is searched in second data in the dictionary in descending order of the hit rates of the mapping relationships, and first data corresponding to the to-be-decompressed data is used as a value obtained after decompressing the to-be-decompressed data. In this way, when a hit rate of a mapping relationship to which the to-be-compressed/to-be-decompressed data belongs is relatively low, a relatively long time is consumed for performing compression/decompression.

Therefore, an embodiment of this disclosure provides a design solution 1: A storage device stores at least two sets, each set includes one or more mapping relationships, each mapping relationship is a mapping relationship between one piece of first data and one piece of second data, storage space occupied by the first data in each mapping relationship is larger than storage space occupied by the second data in the mapping relationship, each set corresponds to one hit rate range, different sets correspond to different hit rate ranges, and a hit rate of a mapping relationship in each set belongs to the hit rate range corresponding to the set.

A quantity of sets included in the storage device and the hit rate range corresponding to each set may be predefined, or may be updated based on stored data. In addition, the mapping relationship may also be updated.

For example, each mapping relationship may be a mapping relationship in the dictionary of the dictionary compression algorithm. Mapping relationships included in the at least two sets may be some or all mapping relationships in the dictionary. For example, the mapping relationships included in the at least two sets may be mapping relationships stored in any storage medium (such as a cache, memory, or a hard disk) in the storage device. If the storage medium is the cache or the memory, the mapping relationships included in the at least two sets may be the some mapping relationships in the dictionary. If the storage medium is the hard disk, the mapping relationships included in the at least two sets may be all the mapping relationships in the dictionary.

For example, each set stored in the dictionary and a hit rate range corresponding to the set may be shown in Table 2:

TABLE 2

| Set | Hit rate range |
| --- | --- |
| Set 1 | (80%, 100%] |
| Set 2 | (50%, 80%] |
| Set 3 | (20%, 50%] |
| Set 4 | [0%, 20%] |

In some embodiments, for data compression, a hit rate of each mapping relationship may be a hit rate of first data in the mapping relationship. For example, the hit rate of the first data may be a value obtained by dividing a quantity of times of compression on the first data within a preset time period by a total quantity of times of compression. For data decompression, a hit rate of each mapping relationship may be a hit rate of second data in the mapping relationship. For example, the hit rate of the second data may be a value obtained by dividing a quantity of times of decompression on the second data within a preset time period by a total quantity of times of decompression.

In these embodiments, when the design solution 1 is applied to a data compression scenario and a data decompression scenario, hit rates of a same mapping relationship are obtained in different mechanisms. Therefore, when the design solution 1 is applied to the data compression scenario and the data decompression scenario, sets included in the storage device may be the same or may be different. In addition, hit rate ranges corresponding to a same set may be the same or may be different. For example, it is assumed that the storage device includes 100 mapping relationships. When the design solution 1 is applied to the data compression scenario, each of the 100 mapping relationships may belong to one of a set A1 and a set A2. When the design solution 1 is applied to the data decompression scenario, each of the 100 mapping relationships may belong to one of a set B1, a set B2, and a set B3.

In some other embodiments, for data compression and data decompression, a hit rate of each mapping relationship may be obtained based on a hit rate of first data in the mapping relationship and a hit rate of second data in the mapping relationship. For example, if a ratio of a quantity of data write times to a quantity of data read times of the storage device is 3:7, and for a mapping relationship, a hit rate of first data in the mapping relationship is 10% in a data write process, and a hit rate of second data in the mapping relationship is 50% in a data read process, a hit rate of the mapping relationship may be obtained according to 0.3× 10%+0.7×50%. Certainly, this embodiment of this disclosure is not limited thereto.

In these embodiments, when the design solution 1 is applied to a data compression scenario and a data decompression scenario, hit rates of a same mapping relationship are obtained in different mechanisms. Therefore, when the design solution 1 is applied to the data compression scenario and the data decompression scenario, sets included in the storage device are the same, and hit rate ranges corresponding to a same set are the same. For example, it is assumed that the storage device includes 100 mapping relationships. When the design solution 1 is applied to the data compression scenario and the data decompression scenario, each of the 100 mapping relationships may belong to one of a set A1 and a set A2.

Figure 9:
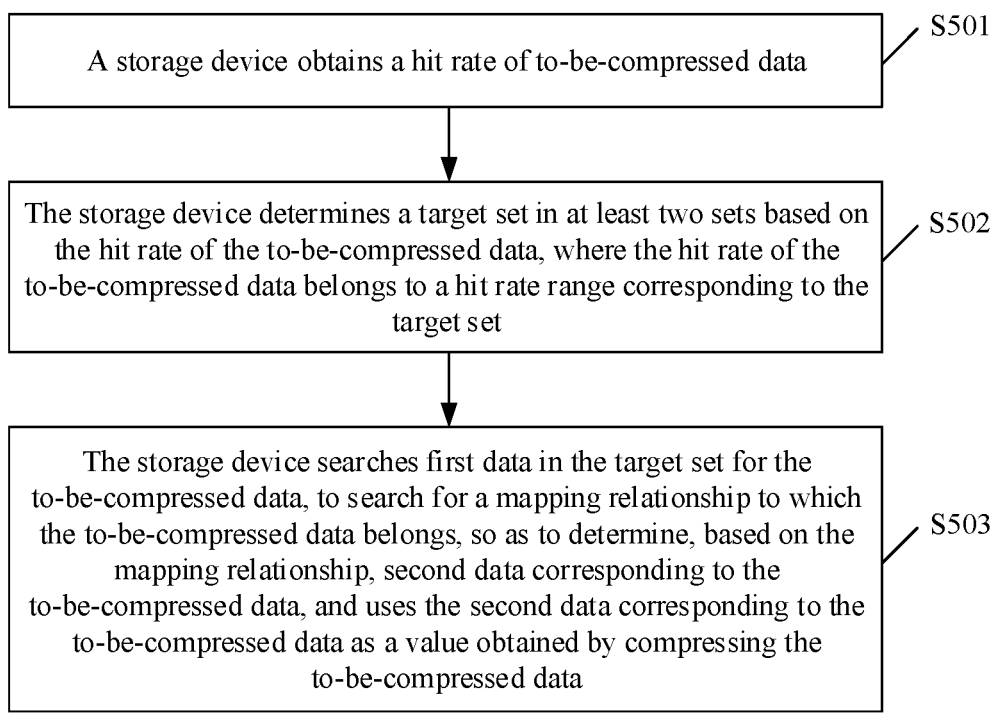
FIG. 9 is a schematic diagram 1 of a data compression method according to an embodiment of this disclosure.

Based on the foregoing design solution 1, FIG. 9 is a schematic diagram of a data compression method according to an embodiment of this disclosure. The method shown in FIG. 9 may include the following operations.

S501. A storage device obtains a hit rate of to-be-compressed data. For a manner of obtaining the hit rate of the to-be-compressed data, refer to the foregoing manner of obtaining the hit rate of the first data. Certainly, this embodiment of this disclosure is not limited thereto.

For example, the to-be-compressed data may be the foregoing delta or current data. Certainly, this embodiment of this disclosure is not limited thereto.

S502. The storage device determines a target set in at least two sets based on the hit rate of the to-be-compressed data. The hit rate of the to-be-compressed data is used to determine a hit rate of a mapping relationship (referred to as a target mapping relationship below) in which the to-be-compressed data is located, and the determined hit rate of the target mapping relationship belongs to a hit rate range corresponding to the target set.

It can be learned from the foregoing description that, when the design solution 1 is applied to a data compression scenario, the hit rate of the mapping relationship may be a hit rate of first data in the mapping relationship, may be obtained based on a hit rate of first data in the mapping relationship and a hit rate of second data in the mapping relationship, or the like. For ease of description, in the following embodiments of the data compression method, an example in which the hit rate of the mapping relationship may be the hit rate of the first data in the mapping relationship is used for description.

For example, if the hit rate of the to-be-compressed data is 75%, the hit rate of the target mapping relationship to which the to-be-compressed data belongs may be 75%. In this case, referring to Table 2, it may be learned that the target set is a set 2.

S503. The storage device searches first data in the target set for the to-be-compressed data, to search for the mapping relationship to which the to-be-compressed data belongs, so as to determine, based on the mapping relationship, second data corresponding to the to-be-compressed data, and uses the second data corresponding to the to-be-compressed data as a value obtained by compressing the to-be-compressed data.

For example, based on the example in S502, the storage device may directly search first data in the set 2 for the to-be-compressed data, so as to compress the to-be-compressed data, instead of successively searching first data for a delta in descending order of hit rate ranges of mapping relationships in the prior art. In this way, a compression time can be shortened.

For example, if the to-be-compressed data is the foregoing delta, the second data corresponding to the to-be-compressed data may be the foregoing described value obtained by compressing the delta. For example, if the to-be-compressed data is the foregoing current data, the second data corresponding to the to-be-compressed data may be the foregoing described value obtained by compressing the current data.

In the data compression method provided in this embodiment, mapping relationships included in the storage device are classified into different sets. In this way, the set in which the to-be-compressed data is located may be directly determined based on the hit rate of the to-be-compressed data. Compared with that in the prior art, a range of searching for the to-be-compressed data is narrowed. Therefore, a compression time can be shortened.

Figure 10:
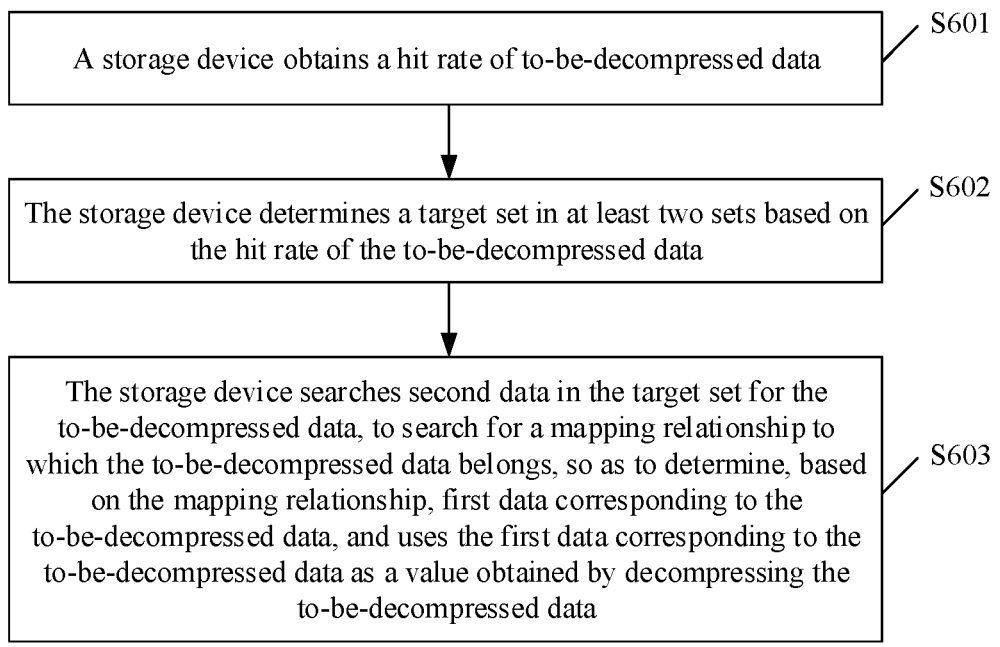
FIG. 10 is a schematic diagram 1 of a data decompression method according to an embodiment of this disclosure.

Based on the foregoing design solution 1, FIG. 10 is a schematic diagram of a data decompression method according to an embodiment of this disclosure. The method shown in FIG. 10 may include the following operations.

S601. A storage device obtains a hit rate of to-be-decompressed data. For a manner of obtaining the hit rate of the to-be-decompressed data, refer to the foregoing manner of obtaining the hit rate of the second data. Certainly, this embodiment of this disclosure is not limited thereto.

For example, the to-be-decompressed data may be the foregoing described value obtained by compressing the delta, or the value obtained by compressing the current data. Certainly, this embodiment of this disclosure is not limited thereto.

S602. The storage device determines a target set in at least two sets based on the hit rate of the to-be-decompressed data, where the hit rate of the to-be-decompressed data is used to determine a hit rate of a target mapping relationship to which the to-be-decompressed data belongs, and the determined hit rate of the target mapping relationship belongs to a hit rate range corresponding to the target set.

It can be learned from the foregoing description that, when the design solution 1 is applied to a data decompression scenario, the hit rate of the mapping relationship may be a hit rate of second data in the mapping relationship, may be obtained based on a hit rate of first data in the mapping relationship and a hit rate of second data in the mapping relationship, or the like. For ease of description, in the following embodiments of the data decompression method, an example in which the hit rate of the mapping relationship may be the hit rate of the second data in the mapping relationship is used for description.

For example, if the hit rate of the to-be-decompressed data is 75%, the hit rate of the target mapping relationship to which the to-be-decompressed data belongs may be 75%. In this case, referring to Table 2, it may be learned that the target set is a set 2.

S603. The storage device searches second data in the target set for the to-be-decompressed data, to search for the mapping relationship to which the to-be-decompressed data belongs, so as to determine, based on the mapping relationship, first data corresponding to the to-be-decompressed data, and uses the first data corresponding to the to-be-decompressed data as a value obtained by decompressing the to-be-decompressed data.

For example, if the to-be-decompressed data is the foregoing value obtained by compressing the delta, the first data corresponding to the to-be-decompressed data may be the foregoing described delta. For example, if the to-be-decompressed data is the foregoing value obtained by compressing the current data, the first data corresponding to the to-be-decompressed data may be the foregoing described current data.

In the data decompression method provided in this embodiment, mapping relationships included in the storage device are classified into different sets. In this way, the set in which the to-be-decompressed data is located may be directly determined based on the hit rate of the to-be-decompressed data. Compared with that in the prior art, a range of searching for the to-be-decompressed data is narrowed. Therefore, a data decompression time can be shortened.

It can be learned from FIG. 2 that storage media of a storage device may include a cache, memory, and a hard disk. Data stored in the cache is some data stored in the memory, and data stored in the memory is some data stored in the hard disk. Currently, a process in which a CPU reads data is as follows: The CPU first searches the cache for to-be-accessed data, and directly reads the to-be-accessed data if the to-be-accessed data is found, or searches the memory for the to-be-accessed data if the to-be-accessed data is not found. Further, if the to-be-accessed data is found, the to-be-accessed data is directly read, or if the to-be-accessed data is not found, the hard disk is searched for the to-be-accessed data. In an example in which a storage technology is a dictionary compression technology, data stored in the cache, the memory, and the hard disk may be a mapping relationship in a dictionary. In this way, when a storage medium (for example, the cache or the memory) includes a relatively large quantity of mapping relationships, and a mapping relationship to which to-be-compressed/to-be-decompressed data belongs is not in the storage medium, a relatively long time is consumed for performing compression/decompression.

Therefore, an embodiment of this disclosure provides a design solution 2: Storage media of a storage device include a cache, memory, and a hard disk, a hit rate of a mapping relationship in the cache is greater than or equal to a hit rate of a mapping relationship in the memory, the hit rate of the mapping relationship in the memory is greater than or equal to a hit rate of a mapping relationship in the hard disk, each mapping relationship is a mapping relationship between one piece of first data and one piece of second data, and storage space occupied by the first data is larger than storage space occupied by the second data. A range in which a hit rate of a mapping relationship in each storage medium is located may be preset, or may be updated based on stored data.

For example, each mapping relationship may be a mapping relationship in a dictionary of a dictionary compression algorithm. For example, each storage medium of the storage device and a hit rate range corresponding to the storage medium may be shown in Table 3.

TABLE 3

| Storage medium | Hit rate range |
| --- | --- |
| Cache | (80%, 100%] |
| Memory | (50%, 100%] |
| Hard disk | [0%, 100%] |

Figure 11:
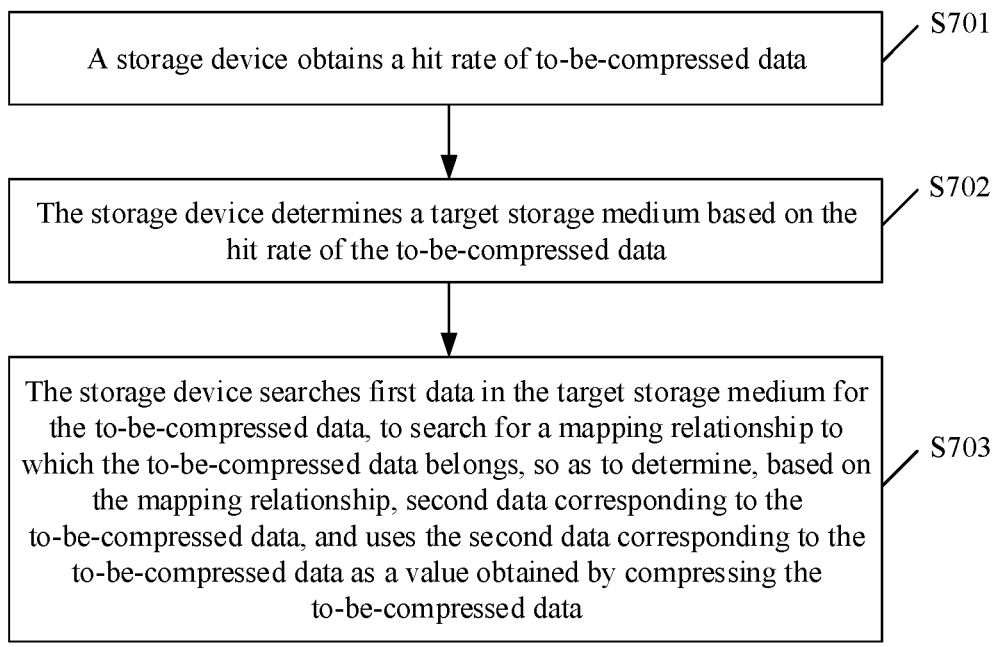
FIG. 11 is a schematic diagram 2 of a data compression method according to an embodiment of this disclosure.

Based on the foregoing design solution 2, FIG. 11 is a schematic diagram of a data compression method according to an embodiment of this disclosure. The method shown in FIG. 11 may include the following operations.

S701. A storage device obtains a hit rate of to-be-compressed data.

S702. The storage device determines a target storage medium based on the hit rate of the to-be-compressed data. The hit rate of the to-be-compressed data is used to determine a hit rate of a target mapping relationship to which the to-be-compressed data belongs. The target storage medium is a cache when the determined hit rate of the target mapping relationship belongs to a hit rate range of a mapping relationship in the cache, the target storage medium is memory when the determined hit rate of the target mapping relationship does not belong to a hit rate range of a mapping relationship in a cache but belongs to a hit rate range of a mapping relationship in the memory, or the target storage medium is a hard disk when the determined hit rate of the target mapping relationship does not belong to a hit rate range of a mapping relationship in memory.

For example, if the hit rate of the to-be-compressed data is 90%, the hit rate of the target mapping relationship to which the to-be-compressed data belongs may be 90%. In this case, referring to Table 3, it may be learned that the target storage medium is the cache. Similarly, if the hit rate of the to-be-compressed data is 60%, the target storage medium may be the memory, or if the hit rate of the to-be-compressed data is 30%, the target storage medium may be the hard disk.

S703. The storage device searches first data in the target storage medium for the to-be-compressed data, to search for the mapping relationship to which the to-be-compressed data belongs, so as to determine, based on the mapping relationship, second data corresponding to the to-be-compressed data, and uses the second data corresponding to the to-be-compressed data as a value obtained by compressing the to-be-compressed data.

For example, if a mapping relationship included in the target storage medium is shown in the foregoing design solution 1, for a specific implementation process of S703, refer to the foregoing S501 to S503. Certainly, S703 may be alternatively implemented according to a method in the prior art.

For examples of the to-be-compressed data and the value obtained by compressing the to-be-compressed data in this embodiment, refer to the embodiment shown in FIG. 9.

If the storage device does not find the to-be-compressed data in the first data in the target storage medium, when no next-level storage medium of the target storage medium exists in the storage device, the to-be-compressed data is used as the value obtained by compressing the to-be-compressed data; or when a next-level storage medium of the target storage medium exists in the storage device, the next-level storage medium of the target storage medium is searched for the to-be-compressed data, and so on, until the to-be-compressed data is found, or until the to-be-compressed data is not found in first data in a last-level storage medium. A next-level storage medium of the cache is the memory, and a next-level storage medium of the memory is the hard disk.

In the data compression method provided in this embodiment, a storage medium that has highest read/write performance and in which the to-be-compressed data is located may be directly determined based on the hit rate of the to-be-compressed data and hit rate ranges of mapping relationships stored in different storage media, read/write performance of the cache is higher than read/write performance of the memory, and the read/write performance of the memory is higher than read/write performance of the hard disk. Compared with that in the prior art, a range of searching for the to-be-compressed data is narrowed. Therefore, a data compression time can be shortened.

Figure 12:
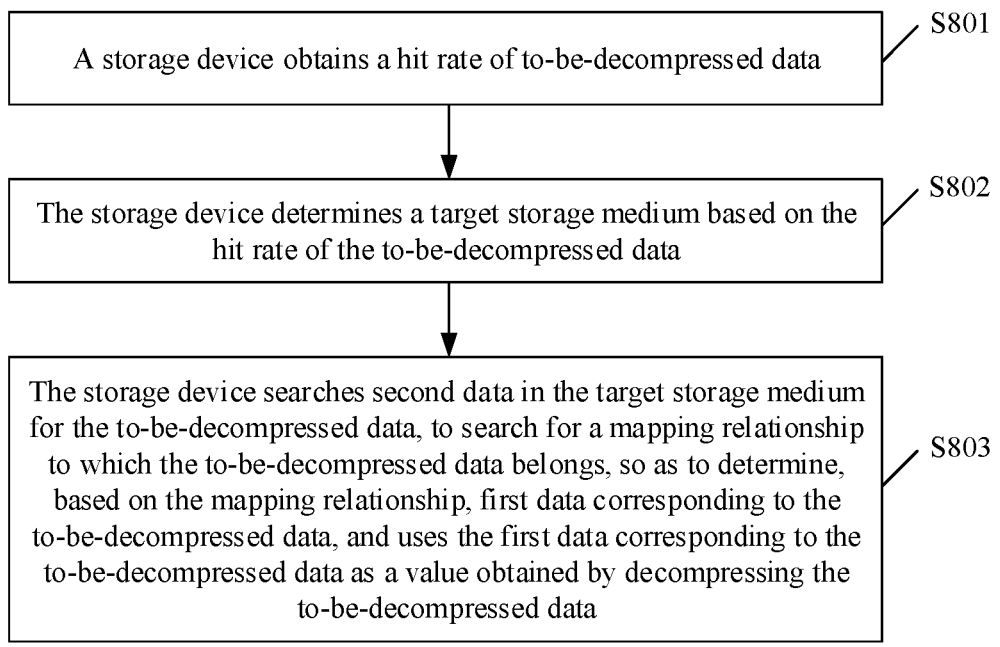
FIG. 12 is a schematic diagram 2 of a data decompression method according to an embodiment of this disclosure.

Based on the foregoing design solution 2, FIG. 12 is a schematic diagram of a data decompression method according to an embodiment of this disclosure. The method shown in FIG. 12 may include the following operations.

S801. A storage device obtains a hit rate of to-be-decompressed data.

S802. The storage device determines a target storage medium based on the hit rate of the to-be-decompressed data. The hit rate of the to-be-decompressed data is used to determine a hit rate of a target mapping relationship to which the to-be-decompressed data belongs. The target storage medium is a cache when the determined hit rate of the target mapping relationship belongs to a hit rate range of a mapping relationship in the cache, the target storage medium is memory when the hit rate of the target mapping relationship does not belong to a hit rate range of a mapping relationship in a cache but belongs to a hit rate range of a mapping relationship in the memory, or the target storage medium is a hard disk when the hit rate of the target mapping relationship does not belong to a hit rate range of a mapping relationship in memory.

For example, if the hit rate of the to-be-decompressed data is 90%, the hit rate of the target mapping relationship to which the to-be-decompressed data belongs may be 90%. In this case, referring to Table 3, it may be learned that the target storage medium is the cache. Similarly, if the hit rate of the to-be-decompressed data is 60%, the target storage medium may be the memory, or if the hit rate of the to-be-decompressed data is 30%, the target storage medium may be the hard disk.

S803. The storage device searches second data in the target storage medium for the to-be-decompressed data, to search for the mapping relationship to which the to-be-decompressed data belongs, so as to determine, based on the mapping relationship, first data corresponding to the to-be-decompressed data, and uses the first data corresponding to the to-be-decompressed data as a value obtained by decompressing the to-be-decompressed data.

For example, if a mapping relationship included in the target storage medium is shown in the foregoing design solution 1, for a specific implementation process of S803, refer to the foregoing S601 to S603. Certainly, S803 may be alternatively implemented according to a method in the prior art.

For examples of the to-be-decompressed data and the value obtained by decompressing the to-be-decompressed data in this embodiment, refer to the embodiment shown in FIG. 10.

In the data decompression method provided in this embodiment, a storage medium that has highest read/write performance and in which the to-be-decompressed data is located may be directly determined based on the hit rate of the to-be-decompressed data and hit rate ranges of mapping relationships stored in different storage media, read/write performance of the cache is higher than read/write performance of the memory, and the read/write performance of the memory is higher than read/write performance of the hard disk. Compared with that in the prior art, a range of searching for the to-be-decompressed data is narrowed. Therefore, a data decompression time can be shortened.

Figure 13:
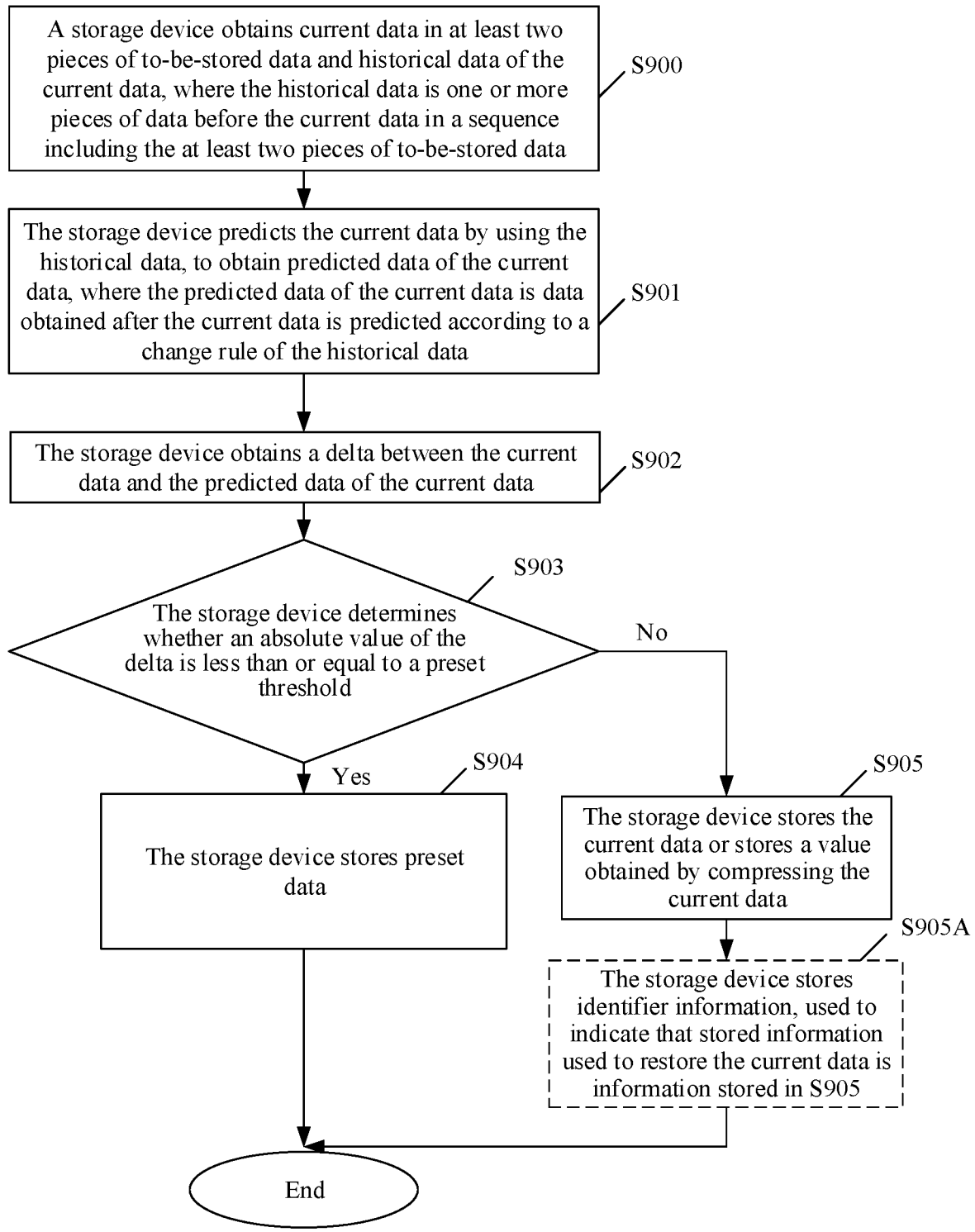
FIG. 13 is a schematic diagram 3 of a data storage method according to an embodiment of this disclosure.

FIG. 13 is a schematic diagram of a data storage method according to an embodiment of this disclosure. The method shown in FIG. 13 may include the following operations.

S900. A storage device obtains current data (namely, current to-be-stored data) in at least two pieces of to-be-stored data and historical data (namely, historical to-be-stored data) of the current data, where the historical data is one or more pieces of data before the current data in a sequence including the at least two pieces of to-be-stored data.

S901. The storage device predicts the current data by using the historical data, to obtain predicted data of the current data. The predicted data of the current data is data obtained after the current data is predicted according to a change rule of the historical data.

S902. The storage device obtains a delta between the current data and the predicted data of the current data.

For implementations of S900 to S902, refer to the foregoing descriptions of the implementations of S100 to S102.

S903. The storage device determines whether an absolute value of the delta is less than or equal to a preset threshold. For example, if the delta is a, the absolute value of the delta may be represented as |a|.

If the absolute value of the delta is less than or equal to the preset threshold, S904 is performed, or if the absolute value of the delta is not less than or equal to the preset threshold, S905 is performed.

S904. The storage device stores preset data. For example, storage space occupied by the preset data is smaller than storage space occupied by the current data.

In an embodiment, the preset data is predefined by the storage device. Optionally, the preset data may be an identifier, and the identifier is used to indicate that the predicted data of the current data can be used as (or approximately used as) the current data. For example, the preset data is a binary number such as "0" or "1".

In an embodiment, the storage space occupied by the preset data is smaller than storage space occupied by each of most or all pieces of to-be-stored data.

It should be noted that, when performing a data storage procedure, the storage device may not need to determine a size relationship between the storage space occupied by the preset data and the storage space occupied by the current data. Instead, when predefining the preset data, the storage device may set, according to the principle "the storage space occupied by the preset data is smaller than storage space occupied by each of most or all pieces of to-be-stored data", the preset data to an identifier that occupies relatively small storage space. In this way, for specific current data, even if that "storage space occupied by the preset data is smaller than storage space occupied by the current data" is not met, from an overall perspective of performing a data storage procedure on a plurality of pieces of to-be-stored data, that "the storage space occupied by the preset data is smaller than storage space occupied by each of most or all pieces of to-be-stored data" may be still met. Therefore, compared with that in the prior art, this helps save storage space.

In an embodiment, the storage device may predefine the preset data based on a factor such as storage overheads.

In an example in which the delta is a difference, when the absolute value of the delta is 0, a compression process in this technical solution is a lossless compression process. When the absolute value of the delta is not 0, a compression process in this technical solution is a lossy compression process. Setting the preset threshold properly helps limit a data loss rate within a specific range. In other words, the preset threshold may be set based on an actual requirement (for example, a requirement within an acceptable lossy compression rate).

After S904 is performed, a storing process for the current data ends.

S905. The storage device stores the current data or stores a value obtained by compressing the current data.

For an implementation of S905, refer to the foregoing description of the implementation of S105.

After S905 is performed, a storing process for the current data ends.

To help the storage device distinguish whether stored information used to restore the current data is "the preset data" or "the value obtained through compression or the current data", so as to determine to-be-read data in a data read procedure, in an embodiment, if S905 is performed, the method may further include the following S905A:

S905A. Store identifier information when the absolute value of the delta is greater than the preset threshold, where the identifier information is used to indicate that the stored information used to restore the current data is the value obtained by compressing the current data, or when the current data is stored, the identifier information is used to indicate that the stored information used to restore the current data is the current data. The identifier information may be used as identifier information of the information used to restore the current data, or information carried in the information used to restore the current data.

For descriptions of a replaceable manner and a beneficial effect of S905A, refer to the foregoing descriptions of the replaceable manner and the beneficial effect of S105A. Details are not described herein again.

In the data storage method provided in this embodiment of this disclosure, the current data is predicted by using the historical data, and the preset data is stored when the absolute value of the delta between the current data and the predicted data of the current data is less than or equal to the preset threshold. Because the storage space occupied by the preset data is smaller than the storage space occupied by the current data, compared with that in a technical solution of directly storing current data in the prior art, storage overheads can be reduced. This technical solution may be applied to a scenario in which a specific data loss is allowed, for example, a scenario such as video playing.

For example, for a sequence Xn={2, 5, 10, 17, 26, 37, 50, 65, 82, 101, 122, 145, 171} including to-be-stored data, if a delta is a difference between the to-be-stored data and predicted data of the to-be-stored data, and a preset threshold is 2, a sequence including data actually stored by a storage device based on a prediction algorithm $x^2+1$ and the embodiment shown in FIG. 13 may be {10, 101, 1010, α, α, α, α, α, α, α, α, α, α}. α is preset data. For first three pieces of data in Xn', a prediction operation is default. With reference to S905A, it may be learned that for the three pieces of data, the storage device may further separately store first identifier information. It can be learned that a range of data that needs to be compressed for storage is significantly reduced, and a repetition probability of the data in the range apparently increases. Therefore, a data compression ratio and compression efficiency can be significantly improved.

Figure 14:
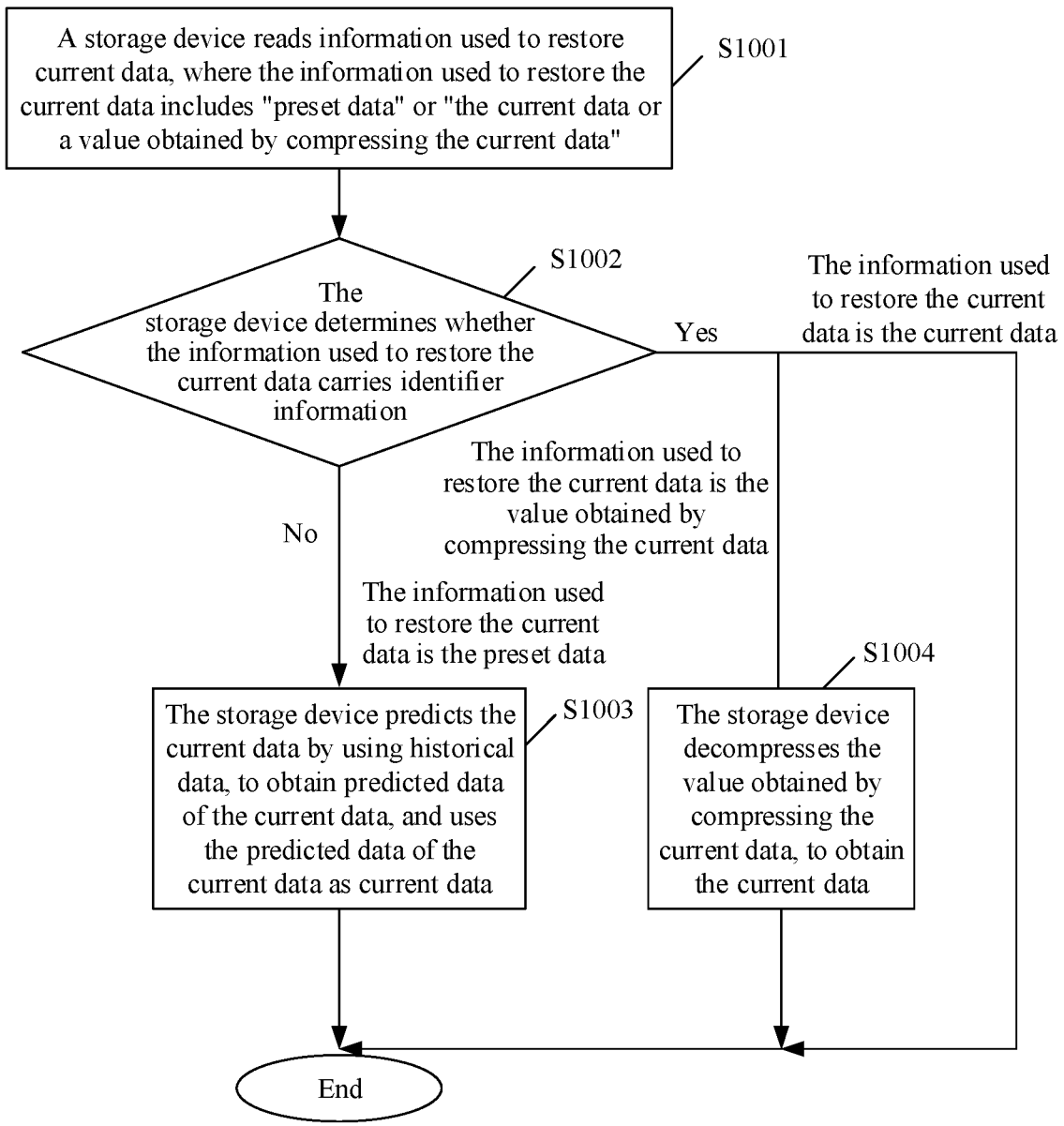
FIG. 14 is a schematic diagram 3 of a data obtaining method according to an embodiment of this disclosure.

FIG. 14 is a schematic diagram of a data obtaining method according to an embodiment of this disclosure. The method shown in FIG. 14 may include the following operations.

S1001. A storage device reads information used to restore current data. The information used to restore the current data includes "preset data" or "the current data or a value obtained by compressing the current data".

Predicted data of the current data is data obtained after the current data is predicted according to a change rule of historical data, and the historical data is one or more pieces of obtained data.

S1002. The storage device determines whether the information used to restore the current data carries identifier information.

It can be learned based on the description in the embodiment shown in FIG. 13 that if a determining result in S1002 is that the information used to restore the current data does not carry the identifier information, it indicates that the information used to restore the current data includes the preset data, and S1003 is performed. If a determining result in S1002 is that the information used to restore the current data carries the identifier information, it indicates that the information used to restore the current data includes the current data or the value obtained by compressing the current data, and when the information used to restore the current data is the value obtained by compressing the current data, S1004 is performed, or when the information used to restore the current data is the current data, an obtaining process for the current data ends.

S1003. The storage device predicts the current data by using the historical data, to obtain the predicted data of the current data, and uses the predicted data of the current data as current data, where the historical data is the one or more pieces of obtained data.

After S1003 is performed, an obtaining process for the current data ends.

S1004. The storage device decompresses the value obtained by compressing the current data, to obtain the current data.

After S1004 is performed, an obtaining process for the current data ends.

The data obtaining method provided in this embodiment corresponds to the data storage method shown in FIG. 13. Therefore, for a beneficial effect in this embodiment, refer to the beneficial effect described in the embodiment shown in FIG. 13. Details are not described herein again.

It should be noted that, for same data, if prediction needs to be performed in a process of performing a data storage procedure and a process of performing a data obtaining procedure, a same prediction algorithm is used (to be specific, values of parameters of prediction algorithms are the same) during prediction. When the prediction algorithm is an AI neural algorithm, because a value of a parameter of the AI neural algorithm may be updated, to successfully obtain the data in the data obtaining procedure, in the data storage procedure, this embodiment of this disclosure provides the following optional implementations:

Optional implementation 1: The storage device may further store a correspondence between a value of a parameter of the AI neural algorithm and information used to restore data. For example, the storage device may perform a snapshot operation each time after the parameter of the AI neural algorithm is updated, to record a correspondence between information used to restore current data and the parameter of the AI neural algorithm used to perform prediction. Certainly, this embodiment of this disclosure is not limited thereto.

For example, it is assumed that an initial moment is a moment t1, a parameter of the AI neural algorithm at the moment t1 is a first parameter, and a parameter of the AI neural algorithm at a moment t2 is updated from the first parameter to a second parameter. In addition, information that is used to restore current data and that is stored in a time period from the moment t1 to the moment t2 and a time period after the moment t2 is respectively information 1 to 100 and information 101 to 500. In this case, the storage device may store a correspondence between the information 1 to 100 and the first parameter, and store a correspondence between the information 101 to 500 and the second parameter.

Optional implementation 2: The parameter of the AI neural algorithm is updated through adaptive learning after the information used to restore the current data is stored, and the information used to restore the current data is updated based on an updated parameter of the AI neural algorithm.

For example, if the foregoing parameter of the AI neural algorithm used to perform prediction (for example, prediction in S101 or S901) is marked as a first parameter of the AI neural algorithm, and a parameter obtained after the first parameter of the AI neural algorithm is updated is marked as a second parameter of the AI neural algorithm, that the information used to restore the current data is updated based on an updated parameter of the AI neural algorithm includes: reading the information used to restore the current data; restoring the current data based on the first parameter (namely, the parameter of the AI neural algorithm before the update) of the AI neural algorithm, the read information used to restore the current data, and the historical data of the current data; predicting the current data based on the second parameter (namely, the updated parameter of the AI neural algorithm) of the AI neural algorithm and the historical data of the current data, to obtain second predicted data, where the second predicted data is data obtained after the current data is predicted according to the change rule of the historical data based on the second parameter of the AI neural algorithm; obtaining a second delta between the current data and the second predicted data; and when storage space occupied by the second delta is smaller than storage space occupied by the current data, updating, to the second delta or a value obtained by compressing the second delta (or the current data, the value obtained by compressing the current data, the preset data, or the like, where for specific stored information, refer to the foregoing method shown in FIG. 5 or FIG. 13), the stored information used to restore the current data. In other words, a data obtaining procedure is performed once by using the parameter that is of the AI neural algorithm and that exists before the update, and after the current data is obtained, a data storage procedure is performed once by using the updated parameter of the AI neural algorithm. In this way, the parameter that is of the AI neural algorithm and that is used when the data storage procedure is performed for the current data is a latest parameter.

Based on the optional implementation 2, the storage device may further store the second parameter of the AI neural algorithm. Alternatively, the storage device updates the stored first parameter of the AI neural algorithm to the second parameter. In other words, the storage device stores the latest parameter of the AI neural algorithm.

The two optional implementations may be applied to the foregoing data storage procedure shown in FIG. 5 or FIG. 13. In comparison between the two optional implementations, the optional implementation 1 may be applied to a scenario in which the storage device has stored a relatively large quantity of data, and the optional implementation 2 may be applied to a scenario in which the storage device has stored a relatively small quantity of data. In addition, the parameter of the AI neural algorithm is updated, so that the predicted data of the current data is closer to the current data. Therefore, data compression efficiency can be further improved in the optional implementation 2. In a specific implementation process, the foregoing optional implementations 1 and 2 may be used in combination, to form a new technical solution. For example, for some stored data, the storage device may perform the foregoing optional implementation 1, and for the other stored data, the storage device may perform the foregoing implementation 2.

Based on the foregoing optional implementation 1, in a data obtaining procedure, the storage device may obtain, based on a correspondence between the information used to restore the current data and the parameter of the AI neural algorithm, the parameter of the AI neural algorithm used to predict the current data. In this case, the predicting the current data by using the historical data, to obtain the predicted data of the current data may include: predicting the current data by using the historical data based on the obtained parameter of the AI neural algorithm, to obtain the predicted data of the current data.

It can be learned based on the description in the foregoing optional implementation 1 that "the parameter of the AI neural algorithm" in the correspondence is a parameter of an AI neural algorithm used in a process of storing "the information used to restore the current data" in the correspondence. The obtained "parameter of the AI neural algorithm used to predict the current data" is "the parameter of the AI neural algorithm" in the correspondence. For example, based on the example in the foregoing optional implementation 1, if the information used to restore the current data is information 99, "the parameter of the AI neural algorithm" in the correspondence is the first parameter, or if the information used to restore the current data is information 200, "the parameter of the AI neural algorithm" in the correspondence is the second parameter.

In addition, if the foregoing optional implementation 1 is applied to the data storage procedure shown in FIG. 5, in a data obtaining procedure, the storage device may obtain the current data according to the foregoing embodiment shown in FIG. 7. If the foregoing optional implementation 1 is applied to the data storage procedure shown in FIG. 13, in a data obtaining procedure, the storage device may obtain the current data according to the foregoing embodiment shown in FIG. 14.

Based on the foregoing optional implementation 2, in a data obtaining procedure, the storage device may perform, based on the stored latest parameter of the AI neural algorithm, the embodiment shown in FIG. 7 or FIG. 14.

The foregoing mainly describes the solutions provided in the embodiments of this disclosure from a perspective of the methods. To implement the foregoing functions, corresponding hardware structures and/or software modules for performing the functions are included. A person skilled in the art should easily be aware that, in combination with the examples described in the embodiments disclosed in this specification, units and algorithm operations can be implemented by hardware or a combination of hardware and computer software in this disclosure. Whether a function is performed by hardware or computer software driving hardware depends on particular applications and design constraints of the technical solutions. A skilled person may use different methods to implement the described functions for each particular application, but it should not be considered that the implementation goes beyond the scope of this disclosure.

In the embodiments of this disclosure, function module division may be performed on a storage device based on the foregoing method examples. For example, each function module may be obtained through division according to each function, or two or more functions may be integrated into one processing module. The integrated module may be implemented in a form of hardware, or may be implemented in a form of a software function module. It should be noted that the module division in the embodiments of this disclosure is an example, and is merely logical function division. There may be another division manner in actual implementation.

Figure 15:
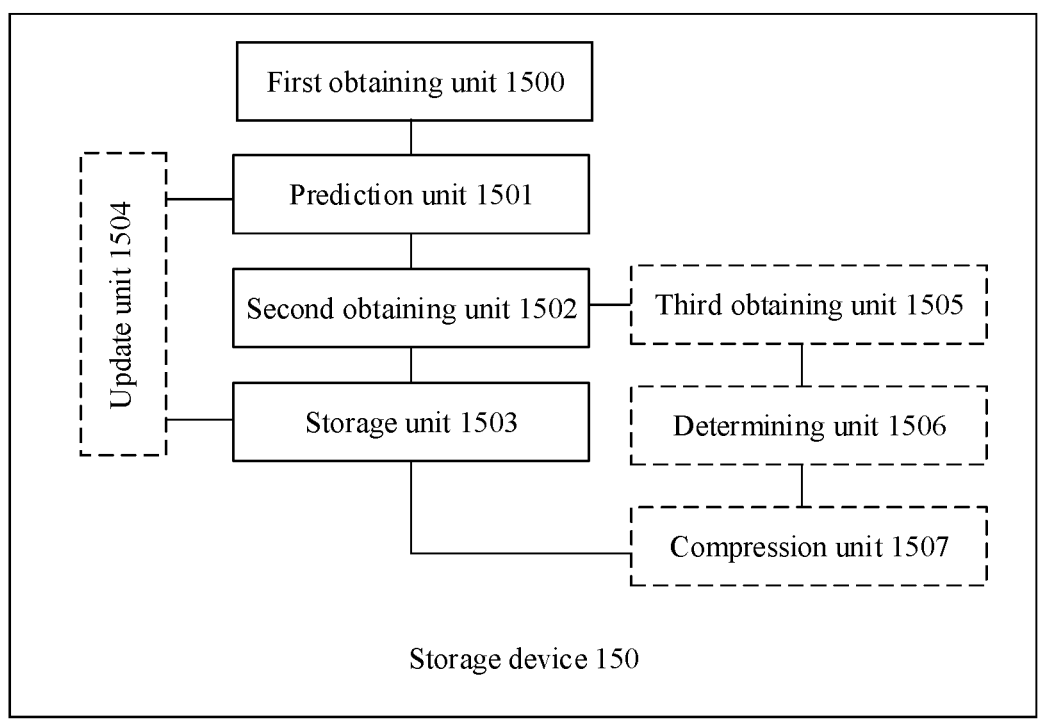
FIG. 15 is a schematic diagram 1 of a storage device according to an embodiment of this disclosure.

FIG. 15 is a schematic structural diagram of a storage device 150 according to an embodiment of this disclosure. The storage device 150 shown in FIG. 15 may be configured to perform the data storage method shown in FIG. 5 or FIG. 6-1 to FIG. 6-4. The storage device 150 may include a first obtaining unit 1500, a prediction unit 1501, a second obtaining unit 1502, and a storage unit 1503. The first obtaining unit 1500 is configured to obtain current data and historical data of the current data. The prediction unit 1501 is configured to predict the current data by using the historical data, to obtain first predicted data of the current data. The second obtaining unit 1502 is configured to obtain a first delta between the current data and the first predicted data. The storage unit 1503 is configured to: when storage space occupied by the first delta is smaller than storage space occupied by the current data, store the first delta or a value obtained by compressing the first delta. For example, with reference to FIG. 5, the first obtaining unit 1500 may be configured to perform S100, the prediction unit 1501 may be configured to perform S101, the second obtaining unit 1502 may be configured to perform S102, and the storage unit 1503 may be configured to perform S104.

In an embodiment, the first obtaining unit 1500 is configured to obtain the current data and the historical data from memory of the storage device 150.

In an embodiment, the storage unit 1503 is further configured to store a correspondence between information used to restore the current data and a parameter of an AI neural algorithm used to perform prediction.

In an embodiment, the storage device 150 further includes an update unit 1504, configured to: update a parameter of an AI neural algorithm through adaptive learning, and update, based on an updated parameter of the AI neural algorithm, information used to restore the current data.

In an embodiment, the update unit 1504 is configured to: read the information used to restore the current data; restore the current data based on the parameter of the AI neural algorithm used to perform the prediction, the information used to restore the current data, and the historical data of the current data; predict the current data based on the updated parameter of the AI neural algorithm and the historical data of the current data, to obtain second predicted data, where the second predicted data is data obtained after the current data is predicted according to a change rule of the historical data based on the updated parameter of the AI neural algorithm; obtain a second delta between the current data and the second predicted data; and when storage space occupied by the second delta is smaller than the storage space occupied by the current data, update, to the second delta or a value obtained by compressing the second delta, the stored information used to restore the current data.

In an embodiment, the storage device 150 includes an AI computing card, and the prediction unit 1501 is configured to predict the current data by using the AI computing card and the historical data, to obtain the first predicted data.

In an embodiment, an algorithm used to perform the compression includes a dictionary compression algorithm, a dictionary of the dictionary compression algorithm includes at least two sets, each set includes one or more mapping relationships, each mapping relationship is a mapping relationship between one piece of first data and one piece of second data, storage space occupied by the first data is larger than storage space occupied by the second data, each set corresponds to a hit rate range, different sets correspond to different hit rate ranges, and the storage device 150 further includes: a third obtaining unit 1505, configured to obtain a hit rate of the first delta; a determining unit 1506, configured to determine a target set in the at least two sets based on the hit rate of the first delta, where the hit rate of the first delta is used to determine a hit rate of a target mapping relationship to which the first delta belongs, and the determined hit rate of the target mapping relationship belongs to a hit rate range corresponding to the target set; and a compression unit 1507, configured to search first data in the target set for the first delta, to determine second data corresponding to the first delta, where the second data corresponding to the first delta is the value obtained by compressing the first delta.

In an embodiment, storage media of the storage device 150 include a cache, the memory, and a hard disk, an algorithm used to perform the compression includes a dictionary compression algorithm, a dictionary of the dictionary compression algorithm includes one or more mapping relationships, each mapping relationship is a mapping relationship between one piece of first data and one piece of second data, storage space occupied by the first data is larger than storage space occupied by the second data, a hit rate of a mapping relationship in the cache is greater than or equal to a hit rate of a mapping relationship in the memory, the hit rate of the mapping relationship in the memory is greater than or equal to a hit rate of a mapping relationship in the hard disk, and the storage device 150 further includes: a third obtaining unit 1505, configured to obtain a hit rate of the first delta; a determining unit 1506, configured to determine a target storage medium based on the hit rate of the first delta, where the hit rate of the first delta is used to determine a hit rate of a target mapping relationship to which the first delta belongs, and the target storage medium is the cache when the determined hit rate of the target mapping relationship belongs to a hit rate range of the mapping relationship in the cache, the target storage medium is the memory when the determined hit rate of the target mapping relationship does not belong to a hit rate range of the mapping relationship in the cache but belongs to a hit rate range of the mapping relationship in the memory, or the target storage medium is the hard disk when the determined hit rate of the target mapping relationship does not belong to a hit rate range of the mapping relationship in the memory; and a compression unit 1507, configured to search first data in the target storage medium for the first delta, to determine second data corresponding to the first delta, where the second data corresponding to the first delta is the value obtained by compressing the first delta.

In an embodiment, the storage unit 1503 is further configured to: when storage space occupied by the first delta is larger than or equal to storage space occupied by the current data, store the current data or a value obtained by compressing the current data. For example, with reference to FIG. 5, the storage unit 1503 may be configured to perform S105.

In an embodiment, the storage unit 1503 is further configured to store identifier information when the storage space occupied by the first delta is larger than or equal to the storage space occupied by the current data, where when the value obtained by compressing the current data is stored, the identifier information is used to indicate that the stored information used to restore the current data is the value obtained by compressing the current data, or when the current data is stored, the identifier information is used to indicate that the stored information used to restore the current data is the current data. For example, with reference to FIG. 5, the storage unit 1503 may be configured to perform S105A.

For example, with reference to FIG. 2, the first obtaining unit 1500, the prediction unit 1501, the second obtaining unit 1502, the update unit 1504, the third obtaining unit 1505, the determining unit 1506, and the compression unit 1507 may all be implemented by using the processor 202, and the storage unit 1503 may be implemented by using the hard disk 204. For another example, with reference to FIG. 3, the prediction unit 1501 may be implemented by using the AI computing card 207, the first obtaining unit 1500, the second obtaining unit 1502, the update unit 1504, the third obtaining unit 1505, the determining unit 1506, and the compression unit 1507 may all be implemented by using the processor 202, and the storage unit 1503 may be implemented by using the hard disk 204.

Figure 16:
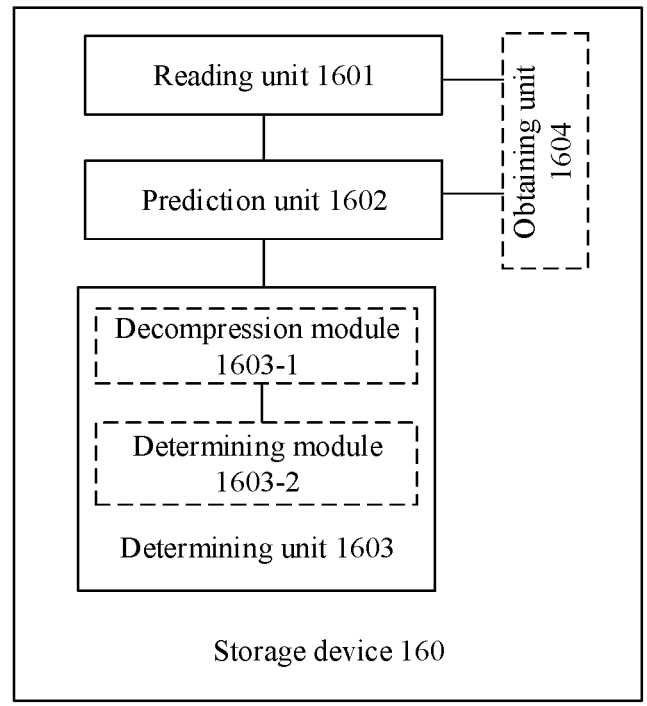
FIG. 16 is a schematic diagram 2 of a storage device according to an embodiment of this disclosure.

FIG. 16 is a schematic structural diagram of a storage device 160 according to an embodiment of this disclosure. The storage device 160 shown in FIG. 16 may be configured to perform the data obtaining method shown in FIG. 7 or FIG. 8A to FIG. 8C. The storage device 160 may include a reading unit 1601, a prediction unit 1602, and a determining unit 1603. The reading unit 1601 is configured to read information used to restore current data, where the information used to restore the current data includes a delta or a value obtained by compressing a delta, the delta is a delta between the current data and predicted data of the current data, and the predicted data of the current data is data obtained after the current data is predicted according to a change rule of historical data. The prediction unit 1602 is configured to predict the current data by using the historical data, to obtain the predicted data of the current data. The determining unit 1603 is configured to determine the current data based on the predicted data of the current data and the information used to restore the current data. For example, with reference to FIG. 7, the reading unit 1601 may be configured to perform S301, the prediction unit 1602 may be configured to perform S304, and the determining unit 1603 may be configured to perform S305.

In an embodiment, the storage device 160 further includes an obtaining unit 1604, configured to obtain the historical data from memory of the storage device 160.

In an embodiment, the storage device 160 further includes the obtaining unit 1604, configured to obtain, based on a correspondence between the information used to restore the current data and a parameter of an AI neural algorithm, the parameter of the AI neural algorithm used to predict the current data. The prediction unit 1602 is configured to predict the current data based on the obtained parameter of the AI neural algorithm by using the historical data, to obtain the predicted data of the current data.

In an embodiment, the storage device 160 includes an AI computing card, and the prediction unit 1602 is configured to predict the current data by using the AI computing card and the historical data, to obtain the predicted data of the current data.

In an embodiment, the information used to restore the current data includes the value obtained by compressing the delta. In this case, the determining unit 1603 includes: a decompression module 1603-1, configured to decompress the value obtained by compressing the delta, to obtain the delta; and a determining module 1603-2, configured to determine the current data based on the delta and the predicted data of the current data. For example, with reference to FIG. 7, the decompression module 1603-1 may be configured to perform S303, and the determining module 1603-2 may be configured to perform S305.

In an embodiment, an algorithm used to perform the decompression includes a dictionary decompression algorithm, a dictionary of the dictionary decompression algorithm includes at least two sets, each set includes one or more mapping relationships, each mapping relationship is a mapping relationship between one piece of first data and one piece of second data, storage space occupied by the first data is larger than storage space occupied by the second data, each set corresponds to a hit rate range, and different sets correspond to different hit rate ranges. In this case, the decompression module 1603-1 is configured to: obtain a hit rate of the value obtained by compressing the delta; determine a target set in the at least two sets based on the hit rate of the value obtained by compressing the delta, where the hit rate of the value obtained by compressing the delta is used to determine a hit rate of a target mapping relationship to which the value obtained by compressing the delta belongs, and the determined hit rate of the target mapping relationship belongs to a hit rate range corresponding to the target set; and search second data in the target set for the value obtained by compressing the delta, to determine first data corresponding to the value obtained by compressing the delta, where the first data corresponding to the value obtained by compressing the delta is the delta.

In an embodiment, storage media of the storage device 160 include a cache, the memory, and a hard disk, an algorithm used to perform the decompression includes a dictionary decompression algorithm, a dictionary of the dictionary decompression algorithm includes one or more mapping relationships, each mapping relationship is a mapping relationship between one piece of first data and one piece of second data, storage space occupied by the first data is larger than storage space occupied by the second data, a hit rate of a mapping relationship in the cache is greater than or equal to a hit rate of a mapping relationship in the memory, and the hit rate of the mapping relationship in the memory is greater than or equal to a hit rate of a mapping relationship in the hard disk. In this case, the decompression module 1603-1 is configured to: obtain a hit rate of the value obtained by compressing the delta; determine a target storage medium based on the hit rate of the value obtained by compressing the delta, where the hit rate of the value obtained by compressing the delta is used to determine a hit rate of a target mapping relationship to which the value obtained by compressing the delta belongs, and the target storage medium is the cache when the determined hit rate of the target mapping relationship belongs to a hit rate range of the mapping relationship in the cache, the target storage medium is the memory when the determined hit rate of the target mapping relationship does not belong to a hit rate range of the mapping relationship in the cache but belongs to a hit rate range of the mapping relationship in the memory, or the target storage medium is the hard disk when the determined hit rate of the target mapping relationship does not belong to a hit rate range of the mapping relationship in the memory; and search second data in the target storage medium for the value obtained by compressing the delta, to determine first data corresponding to the value obtained by compressing the delta, where the first data corresponding to the value obtained by compressing the delta is the delta.

For example, with reference to FIG. 2, the reading unit 1601, the prediction unit 1602, and the determining unit 1603 may all be implemented by using the processor 202. For another example, with reference to FIG. 3, the prediction unit 1602 may be implemented by using the AI computing card 207, and both the reading unit 1601 and the determining unit 1603 may be implemented by using the processor 202.

Figure 17:
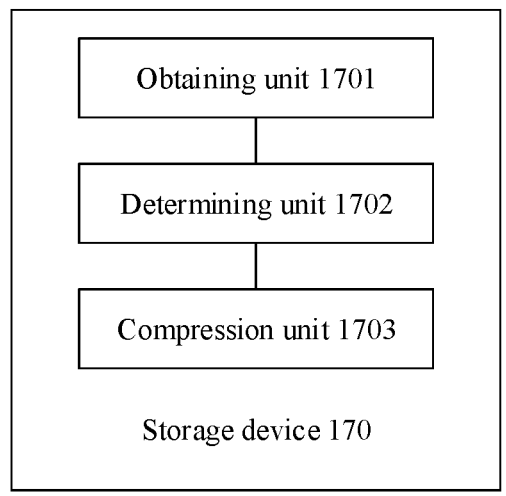
FIG. 17 is a schematic diagram 3 of a storage device according to an embodiment of this disclosure.

FIG. 17 is a schematic structural diagram of a storage device 170 according to an embodiment of this disclosure. The storage device 170 shown in FIG. 17 may be configured to perform the data compression method shown in FIG. 9 or FIG. 11. The storage device 170 may include an obtaining unit 1701, a determining unit 1702, and a compression unit 1703.

In an embodiment, the storage device 170 stores at least two sets, each set includes one or more mapping relationships, each mapping relationship is a mapping relationship between one piece of first data and one piece of second data, storage space occupied by the first data is larger than storage space occupied by the second data, each set corresponds to a hit rate range, and different sets correspond to different hit rate ranges. The obtaining unit 1701 is configured to obtain a hit rate of to-be-compressed data. The determining unit 1702 is configured to determine a target set in the at least two sets based on the hit rate of the to-be-compressed data, where the hit rate of the to-be-compressed data is used to determine a hit rate of a target mapping relationship to which the to-be-compressed data belongs, and the determined hit rate of the target mapping relationship belongs to a hit rate range corresponding to the target set. The compression unit 1703 is configured to: search first data in the target set for the to-be-compressed data, to determine second data corresponding to the to-be-compressed data; and use the second data corresponding to the to-be-compressed data as a value obtained by compressing the to-be-compressed data. For example, with reference to FIG. 9, the obtaining unit 1701 may be configured to perform S501 and/or another operation provided in the embodiments of this disclosure, the determining unit 1702 may be configured to perform S502 and/or another operation provided in the embodiments of this disclosure, and the compression unit 1703 may be configured to perform S503 and/or another operation provided in the embodiments of this disclosure.

In another embodiment, storage media of the storage device 170 include a cache, memory, and a hard disk, a hit rate of a mapping relationship in the cache is greater than or equal to a hit rate of a mapping relationship in the memory, the hit rate of the mapping relationship in the memory is greater than or equal to a hit rate of a mapping relationship in the hard disk, each mapping relationship is a mapping relationship between one piece of first data and one piece of second data, and storage space occupied by the first data is larger than storage space occupied by the second data. The obtaining unit 1701 is configured to obtain a hit rate of to-be-compressed data. The determining unit 1702 is configured to determine a target storage medium based on the hit rate of the to-be-compressed data, where the hit rate of the to-be-compressed data is used to determine a hit rate of a target mapping relationship to which the to-be-compressed data belongs, and the target storage medium is the cache when the determined hit rate of the target mapping relationship belongs to a hit rate range of the mapping relationship in the cache, the target storage medium is the memory when the determined hit rate of the target mapping relationship does not belong to a hit rate range of the mapping relationship in the cache but belongs to a hit rate range of the mapping relationship in the memory, or the target storage medium is the hard disk when the determined hit rate of the target mapping relationship does not belong to a hit rate range of the mapping relationship in the memory. The compression unit 1703 is configured to: search first data in the target storage medium for the to-be-compressed data, to determine second data corresponding to the to-be-compressed data; and use the second data corresponding to the to-be-compressed data as a value obtained by compressing the to-be-compressed data. For example, with reference to FIG. 11, the obtaining unit 1701 may be configured to perform S701 and/or another operation provided in the embodiments of this disclosure, the determining unit 1702 may be configured to perform S702 and/or another operation provided in the embodiments of this disclosure, and the compression unit 1703 may be configured to perform S703 and/or another operation provided in the embodiments of this disclosure.

For example, with reference to FIG. 2 or FIG. 3, the obtaining unit 1701, the determining unit 1702, and the compression unit 1703 may all be implemented by using the process or 202.

Figure 18:
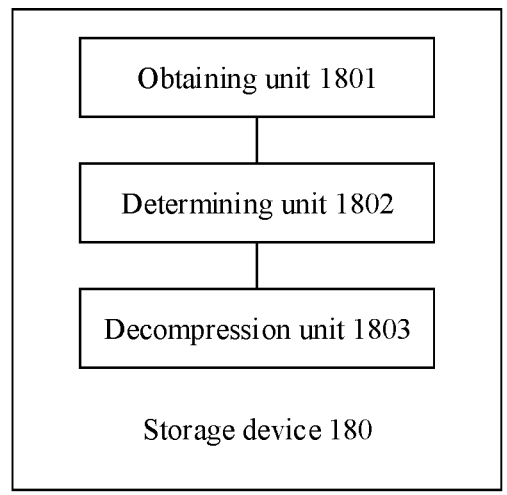
FIG. 18 is a schematic diagram 4 of a storage device according to an embodiment of this disclosure.

FIG. 18 is a schematic structural diagram of a storage device 180 according to an embodiment of this disclosure. The storage device 180 shown in FIG. 18 may be configured to perform the data decompression method shown in FIG. 10 or FIG. 12. The storage device 180 may include an obtaining unit 1801, a determining unit 1802, and a decompression unit 1803.

In an embodiment, the storage device 180 stores at least two sets, each set includes one or more mapping relationships, each mapping relationship is a mapping relationship between one piece of first data and one piece of second data, storage space occupied by the first data is larger than storage space occupied by the second data, each set corresponds to a hit rate range, and different sets correspond to different hit rate ranges. The obtaining unit 1801 is configured to obtain a hit rate of to-be-decompressed data. The determining unit 1802 is configured to determine a target set in the at least two sets based on the hit rate of the to-be-decompressed data, where the hit rate of the to-be-decompressed data is used to determine a hit rate of a target mapping relationship to which the to-be-decompressed data belongs, and the determined hit rate of the target mapping relationship belongs to a hit rate range corresponding to the target set. The decompression unit 1803 is configured to: search second data in the target set for the to-be-decompressed data, to determine first data corresponding to the to-be-decompressed data; and use the first data corresponding to the to-be-decompressed data as a value obtained by decompressing the to-be-decompressed data. For example, with reference to FIG. 10, the obtaining unit 1801 may be configured to perform S601 and/or another operation provided in the embodiments of this disclosure, the determining unit 1802 may be configured to perform S602 and/or another operation provided in the embodiments of this disclosure, and the decompression unit 1803 may be configured to perform S603 and/or another operation provided in the embodiments of this disclosure.

In another embodiment, storage media of the storage device 180 include a cache, memory, and a hard disk, a hit rate of a mapping relationship in the cache is greater than or equal to a hit rate of a mapping relationship in the memory, the hit rate of the mapping relationship in the memory is greater than or equal to a hit rate of a mapping relationship in the hard disk, each mapping relationship is a mapping relationship between one piece of first data and one piece of second data, and storage space occupied by the first data is larger than storage space occupied by the second data. The obtaining unit 1801 is configured to obtain a hit rate of to-be-decompressed data. The determining unit 1802 is configured to determine a target storage medium based on the hit rate of the to-be-decompressed data, where the hit rate of the to-be-decompressed data is used to determine a hit rate of a target mapping relationship to which the to-be-decompressed data belongs, and the target storage medium is the cache when the determined hit rate of the target mapping relationship belongs to a hit rate range of the mapping relationship in the cache, the target storage medium is the memory when the determined hit rate of the target mapping relationship does not belong to a hit rate range of the mapping relationship in the cache but belongs to a hit rate range of the mapping relationship in the memory, or the target storage medium is the hard disk when the determined hit rate of the target mapping relationship does not belong to a hit rate range of the mapping relationship in the memory. The decompression unit 1803 is configured to: search second data in the target storage medium for first data corresponding to the to-be-decompressed data; and use the first data corresponding to the to-be-decompressed data as a value obtained by decompressing the to-be-decompressed data. For example, with reference to FIG. 12, the obtaining unit 1801 may be configured to perform S801 and/or another operation provided in the embodiments of this disclosure, the determining unit 1802 may be configured to perform S802 and/or another operation provided in the embodiments of this disclosure, and the decompression unit 1803 may be configured to perform S803 and/or another operation provided in the embodiments of this disclosure.

For example, with reference to FIG. 2 or FIG. 3, the obtaining unit 1801, the determining unit 1802, and the decompression unit 1803 may all be implemented by using the processor 202.

Figure 19:
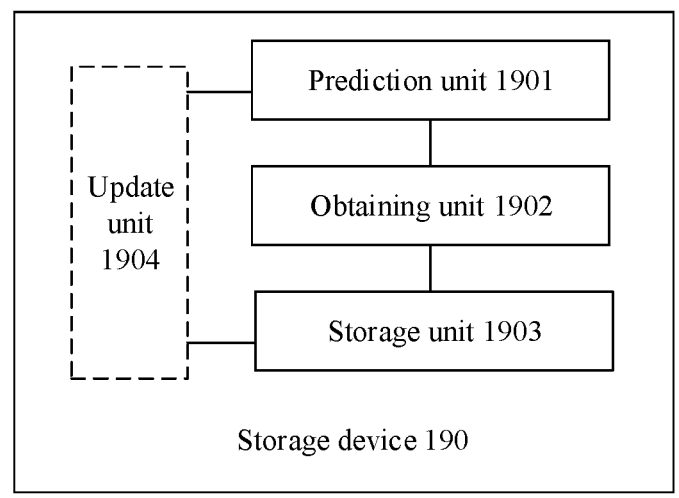
FIG. 19 is a schematic diagram 5 of a storage device according to an embodiment of this disclosure.

FIG. 19 is a schematic structural diagram of a storage device 190 according to an embodiment of this disclosure. The storage device 190 shown in FIG. 19 may be configured to perform the data storage method shown in FIG. 13. The storage device 190 may include a prediction unit 1901, an obtaining unit 1902, and a storage unit 1903. The obtaining unit 1902 is configured to obtain current data and historical data of the current data. The prediction unit 1901 is configured to predict the current data by using the historical data, to obtain first predicted data of the current data. The obtaining unit 1902 is further configured to obtain a first delta between the current data and the first predicted data of the current data. The storage unit 1903 is configured to store preset data when an absolute value of the first delta is less than or equal to a preset threshold. In an embodiment, storage space occupied by the preset data is smaller than storage space occupied by the current data. For example, with reference to FIG. 13, the prediction unit 1901 may be configured to perform S901, the obtaining unit 1902 may be configured to perform S900 and S902, and the storage unit 1903 may be configured to perform S904.

In an embodiment, the storage unit 1903 is further configured to store a correspondence between information used to restore the current data and a parameter of an AI neural algorithm used to perform prediction.

In an embodiment, the storage device 190 further includes an update unit 1904, configured to: update a parameter of an AI neural algorithm through adaptive learning, and update, based on an updated parameter of the AI neural algorithm, information used to restore the current data.

In an embodiment, the update unit 1904 is configured to: read the information used to restore the current data; restore the current data based on the parameter of the AI neural algorithm used to perform the prediction, the information used to restore the current data, and the historical data of the current data; predict the current data based on the updated parameter of the AI neural algorithm and the historical data of the current data, to obtain second predicted data, where the second predicted data is data obtained after the current data is predicted according to a change rule of the historical data based on the updated parameter of the AI neural algorithm; obtain a second delta between the current data and the second predicted data; and when storage space occupied by the second delta is smaller than the storage space occupied by the current data, update, to the second delta or a value obtained by compressing the second delta, the stored information used to restore the current data.

In an embodiment, the storage device 190 includes an AI computing card, and the prediction unit 1901 is configured to predict the current data by using the AI computing card and the historical data, to obtain the first predicted data.

In an embodiment, the storage unit 1903 is further configured to: when an absolute value of the first delta is greater than a preset threshold, store the current data or a value obtained by compressing the current data. For example, with reference to FIG. 13, the storage unit 1903 may be configured to perform S905.

In an embodiment, the storage unit 1903 is further configured to store identifier information when the absolute value of the first delta is greater than the preset threshold, where the identifier information is used to indicate that the stored information used to restore the current data is the value obtained by compressing the current data, or when the current data is stored, the identifier information is used to indicate that the stored information used to restore the current data is the current data. For example, with reference to FIG. 13, the storage unit 1903 may be configured to perform S905A.

For example, with reference to FIG. 2, both the prediction unit 1901 and the obtaining unit 1902 may be implemented by using the processor 202, and the storage unit 1903 may be implemented by using the hard disk 204. For another example, with reference to FIG. 3, the prediction unit 1901 may be implemented by using the AI computing card 207, the obtaining unit 1902 may be implemented by using the processor 202, and the storage unit 1903 may be implemented by using the hard disk 204.

Figure 20:
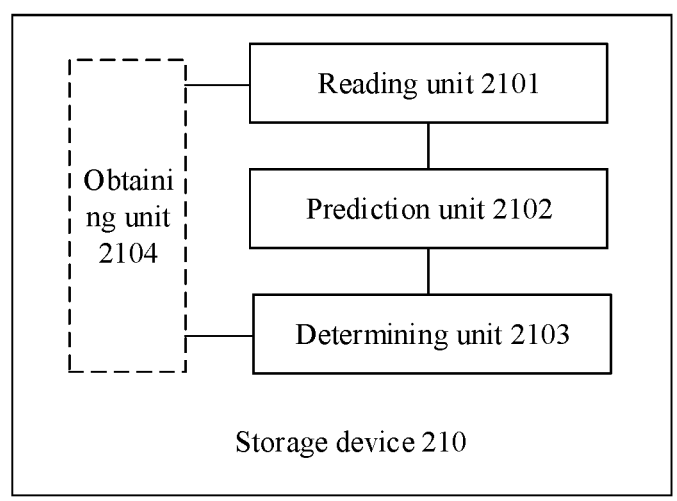
FIG. 20 is a schematic diagram 6 of a storage device according to an embodiment of this disclosure.

FIG. 20 is a schematic structural diagram of a storage device 210 according to an embodiment of this disclosure. The storage device 210 shown in FIG. 20 may be configured to perform the data obtaining method shown in FIG. 14. The storage device 210 may include a reading unit 2101, a prediction unit 2102, and a determining unit 2103. The reading unit 2101 is configured to read information used to restore current data, where predicted data of the current data is data obtained after the current data is predicted according to a change rule of historical data. The prediction unit 2102 is configured to predict the current data by using the historical data when the information used to restore the current data includes preset data, to obtain the predicted data of the current data. The determining unit 2103 is configured to use the predicted data of the current data as current data. For example, with reference to FIG. 14, the reading unit 2101 may be configured to perform S1001, the prediction unit 2102 may be configured to perform a prediction operation in S1003, and the determining unit 2103 may be configured to perform an operation of determining the current data in S1003.

In an embodiment, the storage device 210 further includes an obtaining unit 2104, configured to obtain, based on a correspondence between the information used to restore the current data and a parameter of an AI neural algorithm, the parameter of the AI neural algorithm used to predict the current data. The prediction unit 2102 is configured to predict the current data based on the obtained parameter of the AI neural algorithm by using the historical data, to obtain the predicted data of the current data.

In an embodiment, the storage device 210 includes an AI computing card, and the prediction unit 2102 is configured to predict the current data by using the AI computing card and the historical data, to obtain the predicted data of the current data.

For example, with reference to FIG. 2, the reading unit 2101, the prediction unit 2102, and the determining unit 2103 may all be implemented by using the processor 202. For another example, with reference to FIG. 3, both the reading unit 2101 and the determining unit 2103 may be implemented by using the processor 202, and the prediction unit 2102 may be implemented by using the AI computing card 207.

For descriptions of an implementation and a beneficial effect of any storage device provided in FIG. 15 to FIG. 20, refer to the foregoing corresponding method embodiment. Details are not described herein again.

All or some of the foregoing embodiments may be implemented by using software, hardware, firmware, or any combination thereof. When a software program is used to implement the embodiments, the embodiments may be implemented completely or partially in a form of a computer program product. The computer program product includes one or more computer instructions. When the computer executable instructions are loaded and executed on a computer, all or some of the procedures or functions in the embodiments of the present invention are generated. The computer may be a general-purpose computer, a dedicated computer, a computer network, or another programmable apparatus. The computer instructions may be stored in a computer-readable storage medium or may be transmitted from one computer-readable storage medium to another computer-readable storage medium. For example, the computer instructions may be transmitted from a website, a computer, a server, or a data center to another website, computer, server, or data center in a wired (for example, through a coaxial cable, an optical fibre, or a digital subscriber line (digital subscriber line, DSL)) or wireless (for example, infrared, radio, or microwave) manner. The computer-readable storage medium may be any usable medium that can be accessed by a computer, or may be a data storage device such as a server or a data center integrating one or more usable media. The usable medium may be a magnetic medium (for example, a floppy disk, a hard disk, or a magnetic tape), an optical medium (for example, a DVD), a semiconductor medium (for example, a solid state disk (solid state disk, SSD)), or the like.

What is claimed is:

1. A method for storing data, comprising:
generating, by a processor of a storage device, predicted data for current data based on historical data and a change rule of the historical data, wherein the predicted data represents an amount of data to be stored in the storage device subsequently to reduce storage overheads of the storage device;
obtaining, by the processor, a delta between the predicted data and the current data;
determining, by the processor, a storage space occupied by the delta is smaller than a storage space occupied by the current data; and
storing, by the processor, first information used to restore the current data, wherein the first information includes the delta without including the current data.

2. The method according to claim 1, wherein storing the delta comprises:
compressing the delta.

3. The method according to claim 1, wherein the generating the predicted data for the current data comprises:
generating the predicted data using an artificial intelligence (AI) neural algorithm.

4. The method according to claim 3, further comprising:
storing a correspondence between the delta and the AI neural algorithm.

5. The method according to claim 3, wherein a type of the AI neural algorithm is a normalized least mean square (NLMS) type.

6. The method according to claim 3, wherein a type of the AI neural algorithm is a single-layer perceptron (SLP) type.

7. The method according to claim 3, wherein a type of the AI neural algorithm is a multilayer perceptron (MLP) type.

8. The method according to claim 3, wherein a type of the AI neural algorithm is recurrent neural network (RNN) type.

9. A device, comprising:
an interface; and
a processor coupled to the interface to:
generate predicted data for current data based on historical data and a change rule of the historical data, wherein the predicted data represents an amount of data to be stored subsequently to reduce storage overheads,
obtain a delta between the predicted data and the current data,
determine a storage space occupied by the delta is smaller than a storage space occupied by the current data; and
store first information used to restore the current data, wherein the first information includes the delta without including the current data.

10. The device according to claim 9, wherein the processor is further configured to:
compress the delta.

11. The device according to claim 9, wherein the processor is further configured to:
generate the predicted data using an artificial intelligence (AI) neural algorithm.

12. The device according to claim 11, wherein the processor is further configured to:
store a correspondence between the delta and the AI neural algorithm.

13. The device according to claim 11, wherein a type of the AI neural algorithm is a normalized least mean square (NLMS) type.

14. The device according to claim 11, wherein a type of the AI neural algorithm is a single-layer perceptron (SLP) type.

15. The device according to claim 11, wherein a type of the AI neural algorithm is a multilayer perceptron (MLP) type.

16. The device according to claim 11, wherein a type of the AI neural algorithm is recurrent neural network (RNN) type.

17. A non-transitory machine-readable storage medium having instructions stored therein, which when executed by a processor, cause the processor to:
obtain a delta,
generate predicted data for current data based on historical data and a change rule of the historical data; wherein the delta is a delta between the predicted data and the current data wherein the predicted data represents an amount of data to be stored subsequently to reduce storage overheads,
determine a storage space occupied by the delta is smaller than a storage space occupied by the current data; and
restore first information used to restore the current data, wherein the first information includes the delta without including the current data.

18. The non-transitory machine-readable storage medium according to claim 17, wherein the processor is further configured to:
generate the predicted data using an artificial intelligence (AI) neural algorithm.

19. The non-transitory machine-readable storage medium according to claim 18, wherein the processor is further configured to:
store a correspondence between the delta and the AI neural algorithm.

* * * * *